United States Patent
Yoda

(10) Patent No.: US 7,325,217 B2
(45) Date of Patent: Jan. 29, 2008

(54) AUTOMATIC WIRING METHOD FOR THE CROSSTALK REDUCTION

(75) Inventor: Tomoyuki Yoda, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 313 days.

(21) Appl. No.: 10/888,635

(22) Filed: Jul. 9, 2004

(65) Prior Publication Data

US 2005/0097498 A1    May 5, 2005

(30) Foreign Application Priority Data

Oct. 31, 2003    (JP)    .......................... P2003-371785

(51) Int. Cl.
G06F 17/50    (2006.01)
G06F 17/10    (2006.01)

(52) U.S. Cl. .......................... 716/13; 716/10; 716/14; 703/2

(58) Field of Classification Search .................. 716/6, 716/7, 10, 13, 14; 703/1, 2
See application file for complete search history.

(56) References Cited

U.S. PATENT DOCUMENTS

| 6,519,751 | B2 * | 2/2003 | Sriram et al. ................. 716/13 |
| 6,845,346 | B1 * | 1/2005 | Arunachalam et al. ........ 703/2 |
| 2005/0251775 | A1 * | 11/2005 | Wood .......................... 716/10 |

FOREIGN PATENT DOCUMENTS

| JP | P2000-223578 | 11/2000 |
| JP | P2002-222865 | 9/2002 |
| JP | 2002-328963 | 11/2002 |

OTHER PUBLICATIONS

Tseng et al., "Timing- and crosstalk-driven area routing", Apr. 2001, Computer-Aided Design of Integrated Circuits and Systems, IEEE Transactions on, vol. 20, Issue 4, pp. 528-544.*
H.P. Tseng et al, "Timing and Crosstalk Driven Area Routing," DAC98—35th Design Automation Conference, Jun. 15-19, 1998, San Francisco, CA.
Official Office Action Letter issued Oct. 2, 2007 in counterpart Japanese application (Application No. 2003-371785), with English language translation.

* cited by examiner

Primary Examiner—Jack Chiang
Assistant Examiner—Helen Rossoshek
(74) Attorney, Agent, or Firm—DLA Piper US LLP

(57) ABSTRACT

A computer implemented method for designing a semiconductor integrated circuit includes extracting a global wire susceptible to an influence of crosstalk from among a plurality of global wires passing through a switchbox including a plurality of global routing grids based on a crosstalk standard; setting up a crosspoint restriction to restrict a crosspoint of the global wire susceptible to the influence of the crosstalk intersects with a boundary of the switchbox, based on a wiring restriction data; and carrying out detail wiring of the switchbox based on the crosspoint restriction.

20 Claims, 19 Drawing Sheets

| WIRE | INFLUENCE OF THE CROSSTALK |
|---|---|
| WIRE 11 | SUSCEPTIBLE |
| WIRE 12 | SUSCEPTIBLE |
| WIRE 13 | NOT SUSCEPTIBLE |
| WIRE 14 | NOT SUSCEPTIBLE |

|  | WIRE 11 | WIRE 12 | WIRE 13 | WIRE 14 |
|---|---|---|---|---|
| CROSSPOINT P1 | ◯ | ◯ | ◯ | ◯ |
| CROSSPOINT P2 |  |  | ◯ | ◯ |
| CROSSPOINT P3 | ◯ | ◯ | ◯ | ◯ |
| CROSSPOINT P4 |  |  | ◯ | ◯ |
| CROSSPOINT P5 | ◯ | ◯ | ◯ | ◯ |
| CROSSPOINT P6 |  |  | ◯ | ◯ |

| WIRE | INFLUENCE OF THE CROSSTALK |
|---|---|
| WIRE 21 | SUSCEPTIBLE |
| WIRE 22 | SUSCEPTIBLE |
| WIRE 23 | SUSCEPTIBLE |
| WIRE 24 | SUSCEPTIBLE |
| WIRE 25 | NOT SUSCEPTIBLE |

|  | WIRE 21 | WIRE 22 | WIRE 23 | WIRE 24 | WIRE 25 |
|---|---|---|---|---|---|
| CROSSPOINT P1 | ○ | ○ |  |  | ○ |
| CROSSPOINT P2 |  |  | ○ | ○ | ○ |
| CROSSPOINT P3 | ○ | ○ |  |  | ○ |
| CROSSPOINT P4 |  |  | ○ | ○ | ○ |
| CROSSPOINT P5 | ○ | ○ |  |  | ○ |
| CROSSPOINT P6 |  |  | ○ | ○ | ○ |

FIG. 15

| WIRE | CLOCK SIGNAL SYSTEM |
|---|---|
| WIRE 31 | 1ST CLOCK SIGNAL SYSTEM |
| WIRE 32 | 1ST CLOCK SIGNAL SYSTEM |
| WIRE 33 | 2ND CLOCK SIGNAL SYSTEM |
| WIRE 34 | 2ND CLOCK SIGNAL SYSTEM |

FIG. 16

|  | WIRE 31 | WIRE 32 | WIRE 33 | WIRE 34 |
|---|---|---|---|---|
| CROSSPOINT P1 | ○ | ○ |  |  |
| CROSSPOINT P2 | ○ | ○ |  |  |
| CROSSPOINT P3 |  |  |  |  |
| CROSSPOINT P4 |  |  | ○ | ○ |
| CROSSPOINT P5 |  |  | ○ | ○ |
| CROSSPOINT P6 |  |  | ○ | ○ |

FIG. 19

| WIRE | TRANSITION TIME [ns] |
|---|---|
| WIRE 41 | 0.5 |
| WIRE 42 | 0.5 |
| WIRE 43 | 1.0 |
| WIRE 44 | 1.0 |
| WIRE 45 | 1.5 |

FIG. 20

|  | WIRE 41 | WIRE 42 | WIRE 43 | WIRE 44 | WIRE 45 |
|---|---|---|---|---|---|
| CROSSPOINT P1 | ○ | ○ | ○ | ○ |  |
| CROSSPOINT P2 | ○ | ○ | ○ | ○ |  |
| CROSSPOINT P3 | ○ | ○ | ○ | ○ |  |
| CROSSPOINT P4 |  |  | ○ | ○ |  |
| CROSSPOINT P5 |  |  | ○ | ○ | ○ |
| CROSSPOINT P6 |  |  | ○ | ○ | ○ |

50 1ST SWITCHBOX   60 2ND SWITCHBOX

| WIRE | INFLUENCE OF THE CROSSTALK |
|---|---|
| WIRE 51 | AGGRESSOR WIRE OF 1ST SWITCHBOX |
| WIRE 52 | SUSCEPTIBLE VICTIM WIRE OF 2ND SWITCHBOX |
| WIRE 53 | SUSCEPTIBLE |
| WIRE 61 | SUSCEPTIBLE |
| WIRE 62 | NOT SUSCEPTIBLE |

FIG. 26A WIRE 53
FIG. 26B WIRE 61
FIG. 26C WIRE 51

|  | WIRE 52 | WIRE 53 | WIRE 61 | WIRE 62 |
|---|---|---|---|---|
| CROSSPOINT P1 | ○ | ○ | ○ | ○ |
| CROSSPOINT P2 |  |  | ○ | ○ |
| CROSSPOINT P3 | ○ | ○ | ○ | ○ |
| CROSSPOINT P4 |  |  | ○ | ○ |
| CROSSPOINT P5 | ○ | ○ | ○ | ○ |
| CROSSPOINT P6 |  |  | ○ | ○ |

AUTOMATIC WIRING METHOD FOR THE CROSSTALK REDUCTION

CROSS REFERENCE TO RELATED APPLICATIONS

This application is based upon and claims the benefit of priority from prior Japanese Patent Application P2003-371785 filed on Oct. 31, 2003; the entire contents of which are incorporated by reference herein.

BACKGROUND OF THE INVENTION

1. Field of the Invention

The present invention relates to a design method of a semiconductor integrated circuit, particularly for an automatic design method of wiring of a semiconductor integrated circuit.

2. Description of the Related Art

As a space between wires is reduced along with the miniaturization of a semiconductor integrated circuit, crosstalk attributable to coupling capacitance between the wires has a significant influence on characteristics of the semiconductor integrated circuit. The influence of crosstalk between the wires includes crosstalk noise, crosstalk delay, and the like. The "crosstalk noise" is a phenomenon when a change of a signal transmitted on an affecting wire causes a voltage change in an adjacent wire. The wire affected by the crosstalk will be hereinafter referred to as a "victim wire", and the affecting wire will be hereinafter referred to as an "aggressor wire". The crosstalk noise has a risk of causing malfunction in the semiconductor integrated circuit. In the meantime, the "crosstalk delay" is a phenomenon, when signal arrival time of the aggressor wire overlaps signal arrival time of the victim wire, so that the victim wire on which transition of a signal starts earlier is affected by the transition of a signal on the aggressor wire and a delay in transmission time of the signal on the victim wire is thereby caused. The crosstalk delay causes malfunction or characteristic deterioration of the semiconductor integrated circuit.

In general, a method of wiring a semiconductor integrated circuit is started by dividing a wiring region of a semiconductor integrated circuit after determination of a layout of circuit elements into a plurality of global routing grids. Then, global wiring is carried out for determining which global routing grid the wire passes through. The wire passing through the global routing grid is called "global wire". Thereafter, detail wiring is carried out for determining a layout of wires inside each of the global routing grids. To reduce the influence of the crosstalk, Japanese Patent Laid Open Publication No. 2000-223578 discloses a wiring method in which the influence of the crosstalk is evaluated by carrying out tentative detail wiring after the global wiring, then a crosspoint where the wire intersects with a boundary of the global routing grid is set up based on a result of the evaluation, and then the global wiring is carried out again. Alternatively, there is disclosed a method of improving the influence of the crosstalk by evaluating a possibility of a crosstalk delay after carrying out the global wiring, and by setting up a crosspoint where the wire intersects with a boundary of the global routing grid before the detail wiring (H.-P. Tseng et al., IEEE Trans. Computer-Aided Design, vol. 20, No. 4, p. 528 (2001)).

However, according to the wiring method disclosed in Japanese Patent Laid Open Publication No. 2000-223578, the detail wiring has severe restrictions because all the positions on the boundaries where the wires intersect with the global routing grids are set up before the detail wiring. Moreover, although it is necessary to widen the space between wires to reduce capacitances between the wires, the space between wires cannot be sufficiently widened in a region where wiring density is high. In this case, it is difficult to reduce the crosstalk.

Meanwhile, according to the method disclosed by H.-P. Tseng et al, all the positions on the boundaries where all the wires intersect with the global routing grids are determined before the detail wiring. Therefore, the detail wiring has severe restrictions and has difficulty when the wiring density inside the global routing grids is high. Moreover, since the influence of the crosstalk is taken into account by converting it into delay time, it is not possible to evaluate the influence of the crosstalk noise. Furthermore, it is not possible to optimize the wiring in consideration of overlaps of signal arrival time from among a plurality of aggressor wires.

SUMMARY OF THE INVENTION

An aspect of the present invention inheres in a computer implemented method for designing a semiconductor integrated circuit, including extracting a global wire susceptible to an influence of crosstalk from among a plurality of global wires passing through a switchbox including a plurality of global routing grids based on a crosstalk standard; setting up a crosspoint restriction to restrict a crosspoint of the global wire susceptible to the influence of the crosstalk intersects with a boundary of the switchbox, based on a wiring restriction data; and carrying out detail wiring of the switchbox based on the crosspoint restriction.

Another aspect of the present invention inheres in a computer implemented method for carrying out detail wiring sequentially of a plurality of switchboxes in a semiconductor circuit including continuous arrangement of a plurality of switchboxes each including a plurality of global routing grids, including storing a timing window of an aggressor wire affecting a victim wire of a first switchbox, in an affecting wire data area extracting a global wire susceptible to an influence of crosstalk from among a plurality of global wires passing through a second switchbox and the first switch box based on a crosstalk standard; reading a wiring restriction data stored in a wiring restriction data area and the timing window stored in the affecting wire data area, and setting up a crosspoint restriction to restrict a crosspoint of the global wire susceptible to the influence of the crosstalk intersecting with a boundary of the second switchbox without setting of the crosspoint restriction, based on the wiring restriction data and on the timing window; and carrying out detail wiring of the second switchbox based on the crosspoint restriction.

Still another aspect of the present invention inheres in a computer program product for designing a semiconductor integrated circuit inheres in instructions configured to extract a global wire susceptible to an influence of crosstalk from among a plurality of global wires passing through a switchbox including a plurality of global routing grids based on a crosstalk standard; instructions configured to set up a crosspoint restriction to restrict a crosspoint of the global wire susceptible to the influence of the crosstalk intersects with a boundary of the switchbox, based on a wiring restriction data; and instructions configured to carry out detail wiring of the switchbox based on the crosspoint restriction.

Further still another aspect of the present invention inheres in a computer program product for carrying out detail wiring sequentially of a plurality of switchboxes in a semiconductor circuit including continuous arrangement of a plurality of switchboxes each including a plurality of global routing grids, inheres in instructions configured to store a timing window of an aggressor wire affecting a victim wire of a first switchbox, in an affecting wire data area; instructions configured to extract a global wire susceptible to an influence of crosstalk from among a plurality of global wires passing through a second switchbox and the first switch box based on a crosstalk standard; instructions configured to read a wiring restriction data stored in a wiring restriction data area and the timing window stored in the affecting wire data area, and to set up a crosspoint restriction to restrict a crosspoint of the global wire susceptible to the influence of the crosstalk intersecting with a boundary of the second switchbox without setting of the crosspoint restriction, based on the wiring restriction data and on the timing window; and instructions configured to carry out detail wiring of the second switchbox based on the crosspoint restriction.

BRIEF DESCRIPTION OF DRAWINGS

FIGS. 10A, 10B, 10C, 10D are a schematic view showing an example of timing window of wires passing through the switchbox;

FIG. 15 is a table showing an example of clock signal systems of wires passing through the switchbox;

FIG. 16 is a table showing an example of a crosspoint restriction set up by the automatic design method of the semiconductor integrated circuit according to the third modified example of the first embodiment of the present invention;

FIG. 19 is a table showing an example of signal transition time of wires passing through the switchbox;

FIG. 20 is a table showing an example of a crosspoint restriction set up by the automatic design method of the semiconductor integrated circuit according to the fourth modified example of the first embodiment of the present invention;

FIGS. 26A, 26B, 26C are a schematic view showing an example of timing window of wires passing through the first switchbox of the second switchbox.

DETAILED DESCRIPTION OF THE INVENTION

Figure 1:
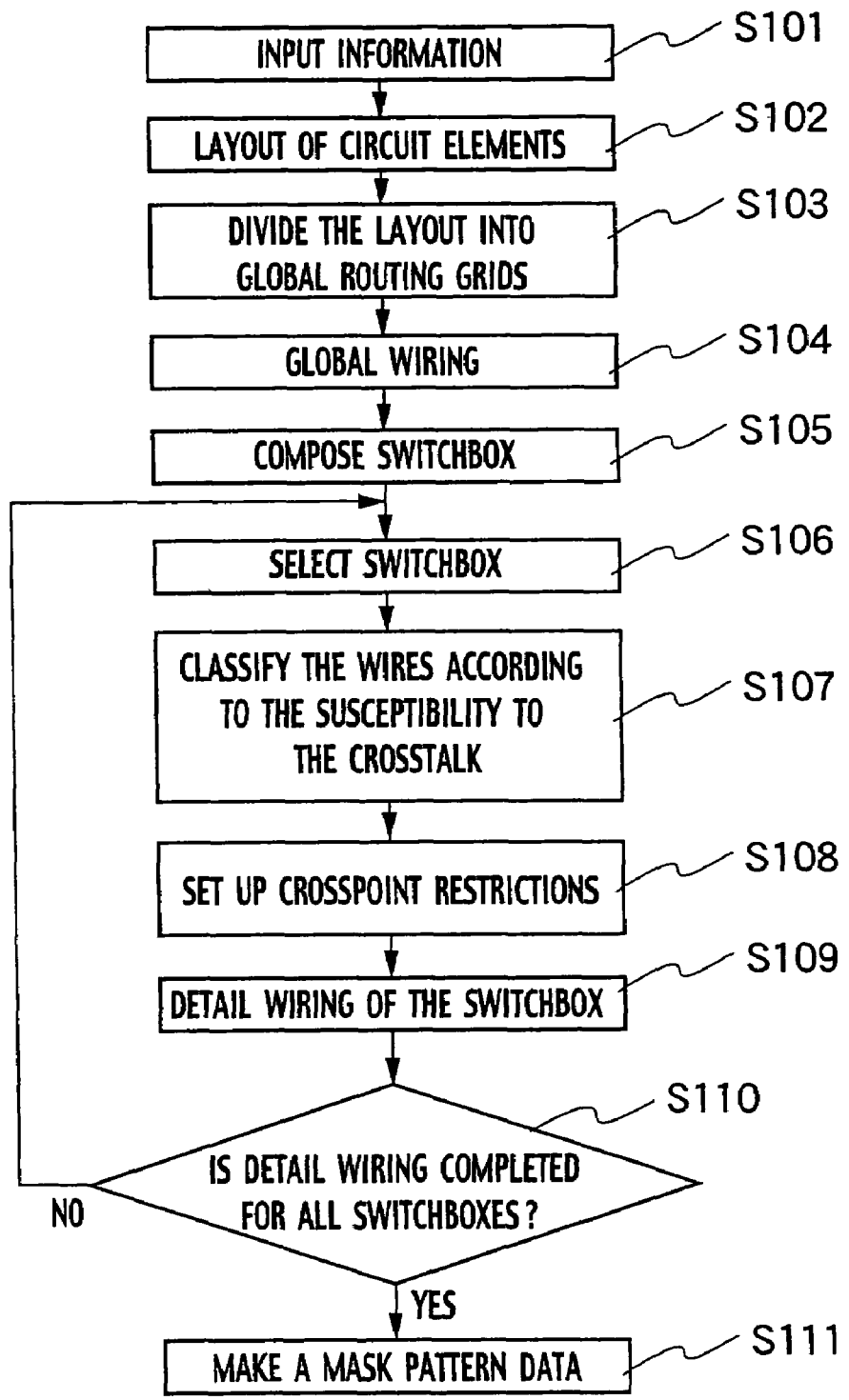
FIG. 1 is a flowchart explaining an automatic design method of a semiconductor integrated circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

Figure 2:
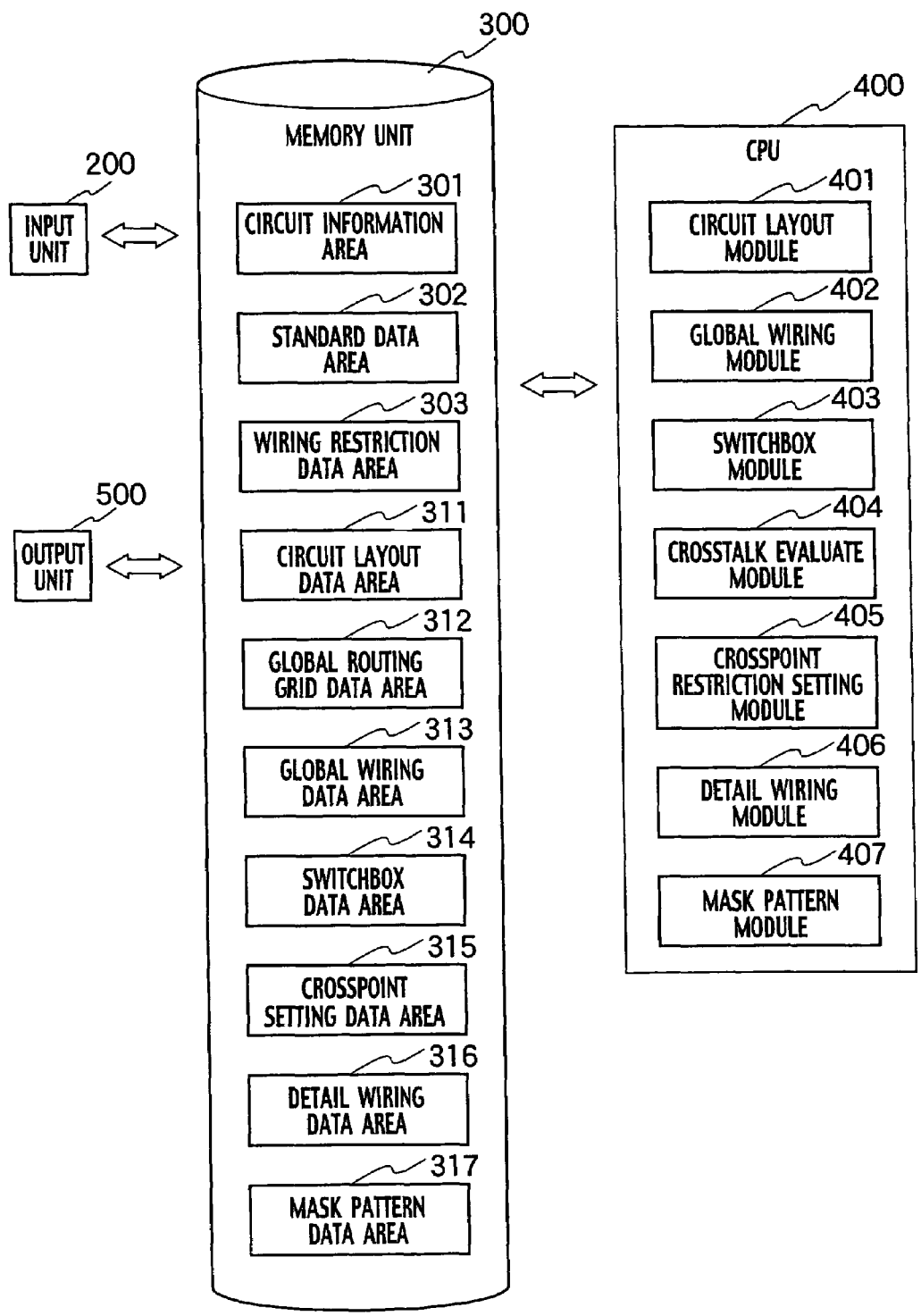
FIG. 2 is a view showing a schematic circuit configuration of the designing system carrying out the automatic design method of the semiconductor integrated circuit according to the first embodiment of the present invention.

An automatic designing method for a semiconductor integrated circuit according to a first embodiment of the present invention shown in FIG. 1 can be executed by a designing system shown in FIG. 2, for example. The designing system shown in FIG. 2 includes an input unit 200, a memory unit 300, a central processing unit (CPU) 400, and an output unit 500. The memory unit 300 includes a circuit information area 301, a standard data area 302, a wiring restriction data area 303, a circuit layout data area 311, a global routing grid data area 312, a global wiring data area 313, a switchbox data area 314, a crosspoint setting data area 315, a detail wiring data area 316, and a mask pattern data area 317. Circuit information such as logic information or electric connection information on the semiconductor integrated circuit is stored in the circuit information area 301. A crosstalk standard is stored in the standard data area 302. A wiring restriction data is stored in the wiring restriction data area 303. Layout information on circuit elements that are arranged on a semiconductor integrated circuit chip, and the like are stored in the circuit layout data area 311. Layout information on the circuit elements after dividing a wiring region of the semiconductor integrated circuit into global routing grids, and the like are stored in the global routing grid data area 312. Information on the global routing grids that allow passages of global wires, and the like are stored in the global wiring data area 313. Information on the global wires that pass through switchboxes, and the like are stored in the switchbox data area 314. The crosspoint restriction is stored in the crosspoint setting data area 315. A result of detail wiring carried out for each switchbox is stored in the detail wiring data area 316. A mask pattern of the semiconductor integrated circuit after the detail wiring is stored in the mask pattern data area 317.

Meanwhile, the CPU 400 includes a circuit layout module 401, a global wiring module 402, a switchbox module 403, a crosstalk evaluate module 404, a crosspoint restriction setting module 405, a detail wiring module 406, and a mask pattern module 407. The circuit layout module 401 reads the circuit information stored in the circuit information area 301 and arranges the circuit elements on the semiconductor integrated circuit chip. The global wiring module 402 reads the circuit information stored in the circuit information area 301 and carries out global wiring. The switchbox module 403 composes switchboxes of the plurality of global routing grids and selects a switchbox for detail wiring. The crosstalk evaluate module 404 reads the crosstalk standard and evaluates the susceptibility of the global wires to the influence of crosstalk. The crosspoint restriction setting module 405 reads the wiring restriction data and sets up crosspoint restrictions of the global wires in the detail wiring. The detail wiring module 406 reads the crosspoint restrictions and carries out detail wiring of the switchboxes. The mask pattern module 407 reads the information in the circuit layout data area 311 and in the detail wiring data area 316, and makes the mask pattern.

In the designing system shown in FIG. 2, the logic information and the electric connection information on the semiconductor integrated circuit subject to designing are read in from the input unit 200, then the layout of the circuit elements and the global wiring are carried out by the CPU 400, and then the switchboxes are composed. Moreover, the crosstalk standard and the wiring restriction data are read in from the input unit 200. In terms of the wires passing through the switchbox, the susceptibility to the influence of crosstalk is judged based on the crosstalk standard that is read in. In terms of the wire judged as susceptible to the influence of crosstalk, the crosspoint restriction of the switchbox that the wire can pass through is set up for each switchbox based on the wiring restriction data. The detail wiring is carried out with reference to the crosspoint restriction thus set up, and the mask pattern is made from the layout information on the circuit elements and the information on the detail wiring after completion of the detail wiring in terms of all the switchboxes.

Here, the "switchbox" is a unit for carrying out the detail wiring, which includes a plurality of global routing grids. One switchbox is set up as a unit including a plurality of global routing grids of 5 rows by 5 columns or 7 rows by 7 columns, for example. The global routing grid has a size that can allow passage of about 10 to 30 wires with a minimum wire width. Accordingly, one edge of the switchbox can allow passage of about 50 to 200 lines. Meanwhile, the "crosstalk standard" is a judgment standard for classifying as to whether it is susceptible or not susceptible to the influence of crosstalk, and wire length and the like are applicable. Here, "the wire susceptible to the influence of crosstalk" is a wire that may become either an aggressor wire or a victim wire. Although the wire is more susceptible to the influence of crosstalk as the wire length becomes longer, the susceptibility to the influence of crosstalk depends on design rules such as the wire width or the space between wires, on voltage values of signals transmitted on the wires, and the like. In general, the wire length susceptible to the influence of the crosstalk becomes shorter along with progress in miniaturization of the semiconductor integrated circuit. For example, under a 0.18 μm design rule, it is possible to classify a wire having a length equal to or longer than 300 μm as the wire susceptible to the influence of crosstalk. However, since susceptibility also depends on the thickness of the wire and the like, the crosstalk standard is examined if necessary. Meanwhile, the "wiring restriction data" is a definition of a restriction that two wires, both susceptible to the influence of crosstalk, cannot pass through mutually adjacent crosspoints, for example. A position on the boundary where the wire intersects with the switchbox is referred to as the "crosspoint". Moreover, a restriction of setting the crosspoint that each wire can pass through in the detail wiring is referred to as the "crosspoint restriction".

Basic steps of the automatic designing method for a semiconductor integrated circuit will be described according to the first embodiment of the present invention with reference to the flowchart of FIG. 1, the designing system of FIG. 2, and FIG. 3.

(a) Firstly, in Step S101 of FIG. 1, the circuit information on the semiconductor integrated circuit is inputted from the input unit 200 shown in FIG. 2 and is stored in the circuit information area 301. Moreover, the crosstalk standard is inputted from the input unit 200 and is stored in the standard data area 302. In addition, the wiring restriction data is inputted from the input unit 200 and is stored in the wiring restriction data area 303.

(b) Next, in Step S102, the circuit information stored in the circuit information area 301 is read and the circuit layout module 401 determines the layout of the circuit elements. A terminal a1, a terminal a2, a terminal b1, a terminal b2, a terminal c1, a terminal c2, a terminal d1, and a terminal d2 on a semiconductor integrated circuit chip 100 shown in FIG. 3 are input/output terminals of circuit elements that omitted illustration. The determined layout information on the circuit elements, input/output terminal layout information on the respective circuit elements, and the like are stored in the circuit layout data area 311.

(c) Next, in Step S103, the wiring region of the semiconductor integrated circuit after determination of the layout of the circuit elements by the global wiring module 402 is divided into the plurality of global routing grids. FIG. 3 shows an example of dividing the wiring region of the semiconductor integrated circuit chip 100 into the global routing grids of 20 rows by 20 columns indicated by chain lines. The information on the divided global routing grids is stored in the global routing grid data area 312.

(d) In Step S104, the circuit information stored in the circuit information area 301 and the input/output terminal layout information on the circuit elements which is stored in the circuit layout data area 311 are read, and the global wiring is carried out by the global wiring module 402 for determining as to which global routing grid the wire passes through among the circuit elements. In the example shown in FIG. 3, wires 11 to 14 are subjected to the global wiring. The wire 11 connects the terminal a1 to the terminal a2, and the wire 12 connects the terminal b1 to the terminal b2. Moreover, the wire 13 connects the terminal c1 to the terminal c2, and the wire 14 connects the terminal d1 to the terminal d2. Results of the global wiring are stored in the global wiring data area 313.

(e) Next, in Step S105, the wiring region of the semiconductor integrated circuit, after carrying out global wiring, is redivided into a plurality of switchboxes by the switchbox module 403. As described above, the switchbox is composed of a plurality of global routing grids of 3 rows by 3 columns, 5 rows by 5 columns, or 7 rows by 7 columns as a unit, for example. In the example shown in FIG. 3, the wiring region of the semiconductor integrated circuit chip 100 is redivided into the switchboxes composed of 5 rows by 5 columns. It is to be noted, however, that the illustration of switchboxes other than a switchbox 10 is omitted herein. The wires 11 to 14 pass through a global routing grid 15 of the switchbox 10. Information on the global routing grids constituting the switchboxes, the global wires passing through the switchboxes, and the crosspoints, is stored in the switchbox data area 314.

(f) In Step S106, priorities of the switchboxes for carrying out the detail wiring are determined by the switchbox module 403 based on the information on the plurality of switchboxes stored in the switchbox data area 314. It is efficient and desirable that the priorities of the switchboxes for carrying out the detail wiring are determined such that the switchbox with higher wiring density or the switchbox more susceptible to the influence of crosstalk is subjected to the detail wiring earlier.

(g) Next, in Step S107, the crosstalk evaluation module 404 reads the crosstalk standard stored in the standard data area 302 and classifies the global wires passing through the selected switchbox into the global wires susceptible to the influence of crosstalk and the global wires not susceptible to the influence of crosstalk. Results of classification are additionally stored in the global wiring data area 313 as information on the respective global wires.

(h) Next, in Step S108, the information on the global wires stored in the global wiring data area 313 and the wiring restriction data stored in the wiring restriction data area 303 are read, and the crosspoint restriction of the detail wiring is set up by the crosspoint restriction setting module 405. The method of setting the crosspoint restriction is performed while considering the influence of crosstalk and will be described later. The crosspoint restriction set up is stored in the crosspoint setting data area 315.

(i) Next, in Step S109, the crosspoint restriction stored in the crosspoint setting data area 315 is read, and the detail wiring of the switchbox is carried out by the detail wiring module 406. A result of the detail wiring is stored in the detail wiring data area 316.

(j) Next, in Step S110, judgment is made as to whether the detail wiring is completed for all the switchboxes. When there is a switchbox for which the detail wiring is not completed, the process returns to Step S106 and the detail wiring is carried out for the subsequent switchbox. When the detail wiring is completed for all the switchboxes, the detail wiring is terminated.

(k) Next, in Step S111, the layout information on the circuit elements stored in the circuit layout data area 311 and the information on the detail wiring stored in the detail wiring data area 316 are retrieved, and mask pattern data on the semiconductor integrated circuit is made by the mask pattern module 407. The mask pattern data is stored in the mask pattern data area 317. The mask pattern data can be outputted from the output unit 500 in a format such as an electronic file, and is used for creation of a mask or a reticle for photolithography and the like.

In the above description, the classification into global wires susceptible to the influence of crosstalk and the global wires not susceptible to the influence of crosstalk is carried out in Step S107 after the selection of the switchbox in Step S106. However, when the classification is carried out based on the wire length as the standard, for example, it is possible to carry out the classification after execution of the global wiring in Step S104 and so forth.

Figure 3:
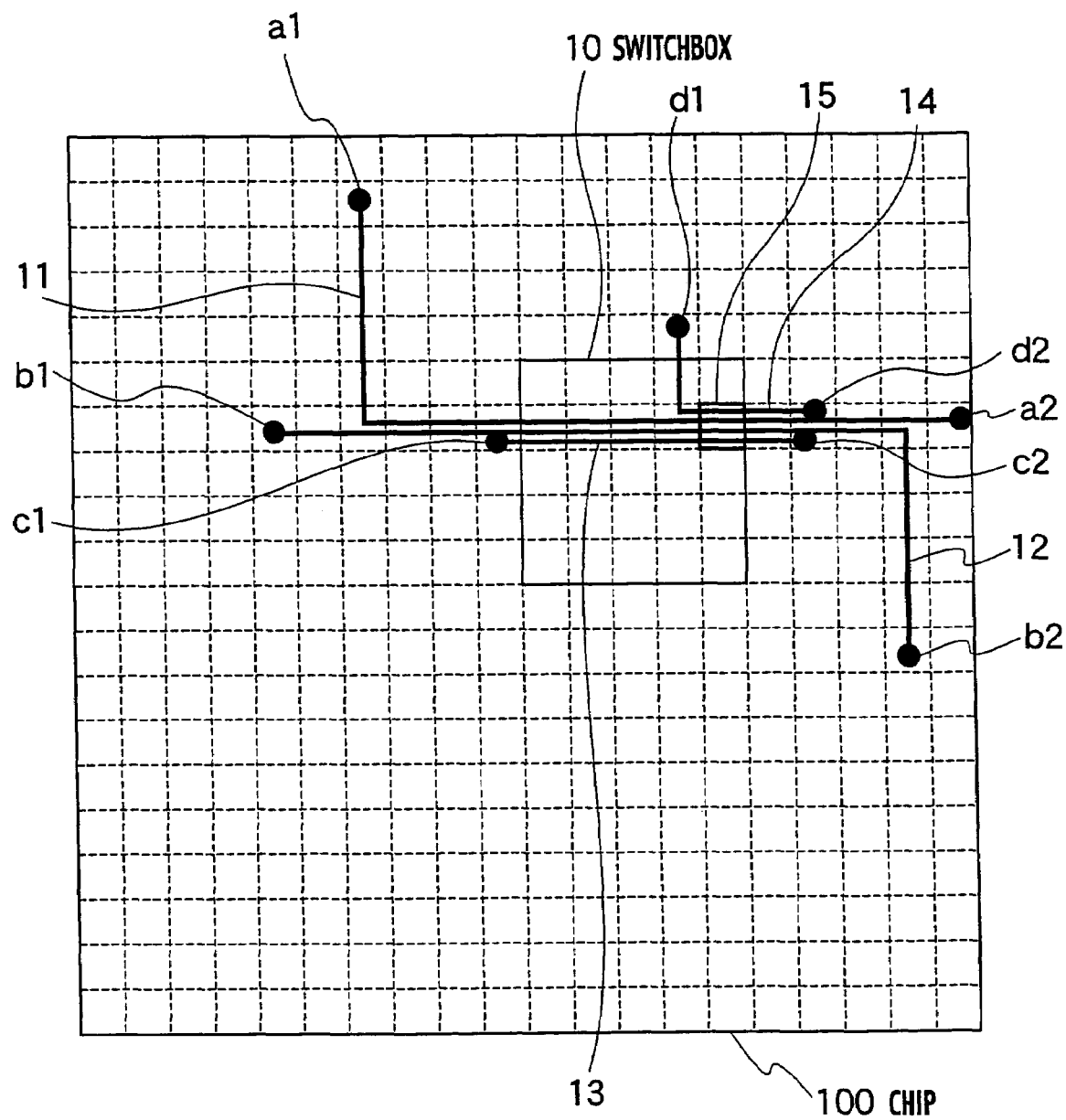
FIG. 3 is a plane view showing an example of a semiconductor integrated circuit to explain a global routing grid and a switchbox determined by the automatic design method of the semiconductor integrated circuit according to the first embodiment of the present invention.
Figures 4, 5:
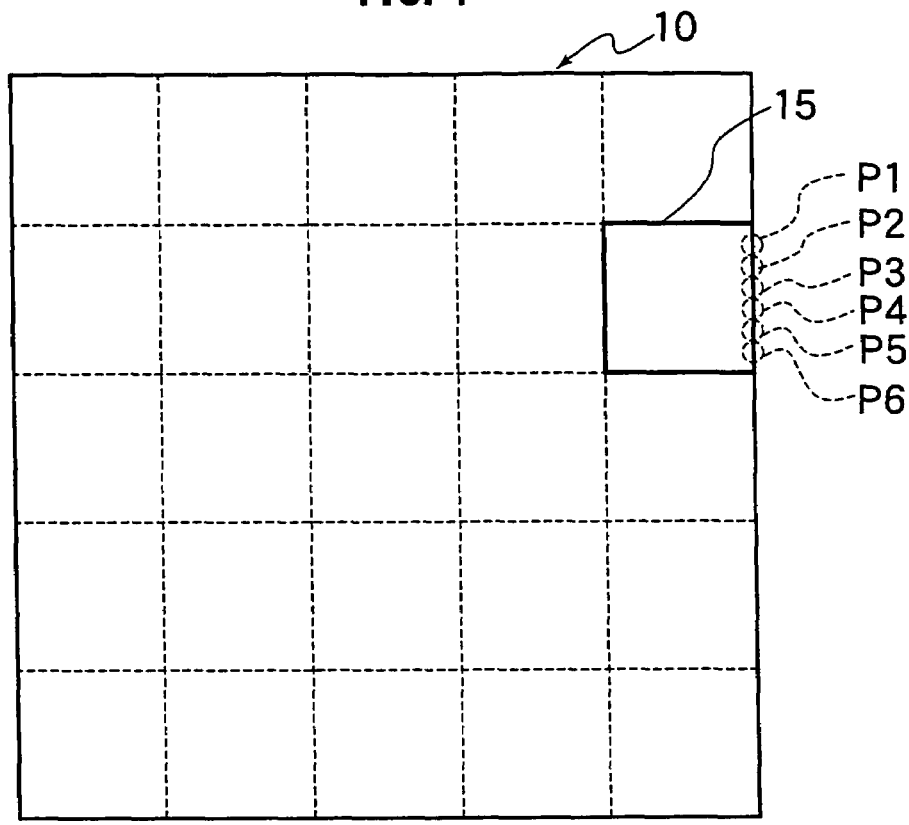
FIG. 4 is a schematic view showing an example of the switchbox to explain a crosspoint.
FIG. 5 is a table showing an example of susceptibility to the influence of crosstalk of wires passing through the switchbox.

Next, an example of carrying out the classification into the wires susceptible to the influence of crosstalk and the wires not susceptible thereto based on the wire length will be exemplified by use of FIG. 3. The crosspoints of the global routing grid 15 of the switchbox 10 include crosspoints P1 to P6 as shown in FIG. 4.

(a) In Step S101 of FIG. 1, the wire length defined as the crosstalk standard is stored in the standard data area 302 shown in FIG. 2. Moreover, the wiring restriction data that a point where one of the global wires susceptible to the influence of crosstalk passing through a boundary of the switchbox fails to neighbor another point where another one of the global wires susceptible to the influence of crosstalk passing through the boundary of the switchbox, are stored in the wiring restriction data area 303.

(b) In Step S107, the crosstalk evaluate module 404 reads the crosstalk standard stored in the standard data area 302 and classifies the wires 11 to 14 into the wires susceptible to the influence of crosstalk and the wires not susceptible to the influence of crosstalk. As a consequence, results of classification that the wire 11 and the wire 12 are susceptible to the influence of crosstalk and that the wire 13 and the wire 14 are not susceptible thereto as shown in FIG. 5, for example, are stored in the global wiring data area 313.

Figures 6, 7:
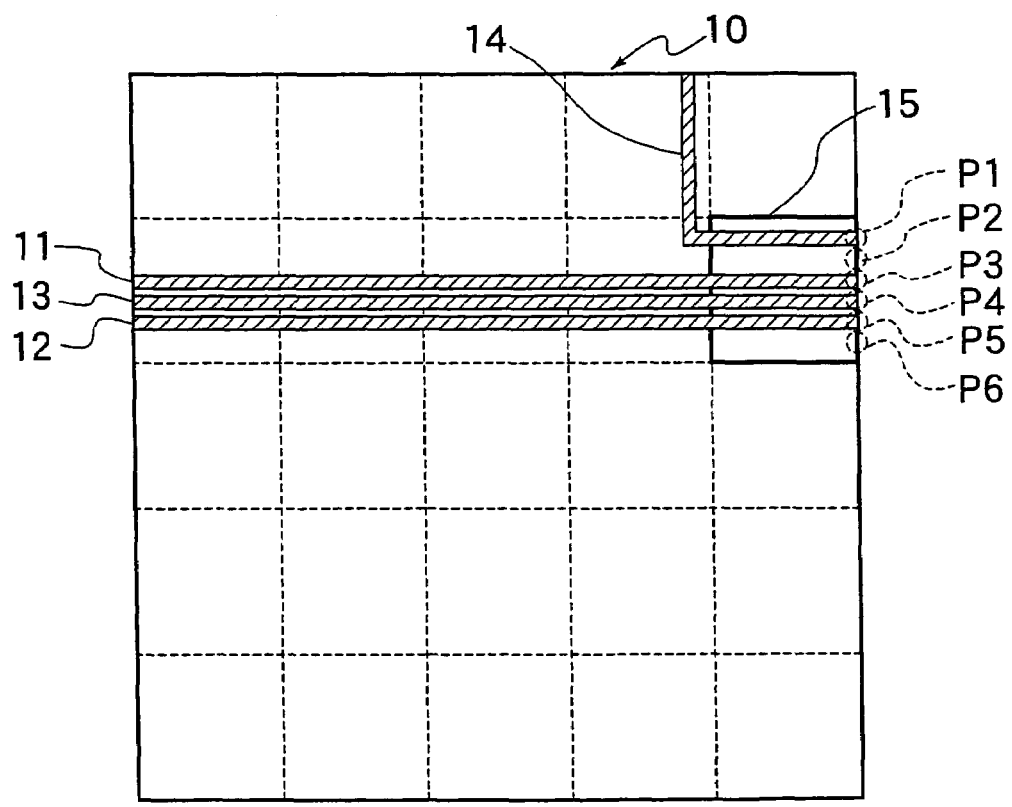
FIG. 6 is a table showing an example of a crosspoint restriction set up by the automatic design method of the semiconductor integrated circuit according to the first embodiment of the present invention.
FIG. 7 is a schematic view showing an example of the switchbox to explain detail wiring by the automatic design method of the semiconductor integrated circuit according to the first embodiment of the present invention.

(c) Next, in Step S108, the crosspoint restriction setting module 405 reads the wiring restriction data stored in the wiring restriction data area 303, and sets up the crosspoint restrictions based on the wiring restriction data. Concretely, the crosspoint restrictions including the restriction that "the wire 11 and the wire 12 fail to pass through mutually adjacent crosspoints" are set up. Accordingly, the crosspoint restrictions are set up as shown in FIG. 6. The crosspoint restrictions thus set up are stored in the crosspoint setting data area 315. FIG. 6 shows the crosspoints where the wires can pass through, indicating that the wire 11 can pass through the crosspoint P1, the crosspoint P3, and the crosspoint P5, for example. Here, the wire 12, the wire 13, and the wire 14 can also pass through the crosspoint P1. However, when the wire 11 is set to pass through the crosspoint P1, other wires are set to pass through the crosspoints that are different from the crosspoint P1. In this case, the wire 12 can pass through either the crosspoint 3 or the crosspoint P5. Meanwhile, there are no restrictions on crosspoints that the wire 13 and the wire 14 can pass through because these wires are not susceptible to the influence of crosstalk.

(d) Next, FIG. 7 shows an example in which the detail wiring module 406 reads the crosspoint restrictions of FIG. 6 and carries out the detail wiring of the switchbox 10 in Step S109. The wire 11 passes through the crosspoint P3, the wire 12 passes through the crosspoint P5, the wire 13 passes through the crosspoint P4, and the wire 14 passes through the crosspoint P1.

As described above, the automatic designing method for a semiconductor integrated circuit according to the first embodiment of the present invention only sets up the crosspoints of the switchboxes where the wires pass through. Therefore, it is possible to reduce designing time compared to setting up the entire wiring region. Moreover, the restrictions for the detail wiring are not severe because the restrictions are based on the crosspoint restriction that restricts only the crosspoints where the wires susceptible to the influence of crosstalk pass through.

According to the automatic designing method for a semiconductor integrated circuit of the first embodiment of the present invention, it is possible to provide a semiconductor integrated circuit with less restrictions on detail wiring, shorter designing time, and a reduced influence of crosstalk, by means of setting up a crosspoint restriction such that wires being susceptible to the influence of crosstalk fail to pass through mutually adjacent crosspoints of a switchbox.

To facilitate explanation, a description has been given on the case where the crosspoint restrictions of the switchbox 10 are located on the boundary on one edge. However, it is by all means possible to set up the crosspoint restriction on a boundary on another edge. Moreover, FIG. 6 shows an example of the crosspoint restriction wherein the crosspoints that the wire 11 and the wire 12 can pass through are defined as the crosspoint P1, the crosspoint P3, and the crosspoint P5. However, it is by all means possible to set the crosspoint restriction wherein the crosspoints which the wire 11 and the wire 12 can pass through are defined as the crosspoint P2, the crosspoint P4, and the crosspoint P6.

The series of automatic designing operations shown in FIG. 1 can be executed by controlling the designing system shown in FIG. 2 by use of a program having an algorithm that is equivalent to FIG. 1. This program may be stored in the memory unit 300 that constitutes the designing system shown in FIG. 2. Alternatively, it is possible to execute a series of automatic designing operations of the present invention by saving this program in a computer-readable recording medium and causing the memory unit 300 shown in FIG. 2 to read this recording medium. Here, the "computer-readable recording medium" means a medium capable of recording a program, such as an external memory device of a computer, a semiconductor memory, a magnetic disk, an optical disk, a magneto optical disk, or a magnetic tape and the like. Concretely, the "computer-readable recording medium" includes a flexible disk, a CD-ROM, an MO disk, a cassette tape, an open reel tape, and the like.

(First Modified Example)

It is possible to further reduce the influence of crosstalk in the semiconductor integrated circuit by setting the crosspoint restrictions such that the wires sharing the same signal arrival time and having a high possibility of causing a crosstalk delay fail to pass through the mutually adjacent crosspoints. However, since the signal arrival time of the wire depends on an input pattern and the like, it is necessary to provide a certain range upon examination. Such a range of the signal arrival time will be hereinafter referred to as a "timing window". An example of the setting of the crosspoint restrictions and the detail wiring considering the timing window of the wires in the automatic designing method for a semiconductor integrated circuit will be described below, according to the first embodiment of the present invention, by use of the designing system of FIG. 2 and a flowchart of FIG. 8. This example is different from the automatic designing method shown in FIG. 1 in that the crosspoint restrictions are set up while considering the timing window of the wires. The example will be described below in the case where wires 21 to 25 having susceptibility to the influence of crosstalk as shown in FIG. 9, pass through the global routing grid 15 of the switchbox 10 subject to the detail wiring. As shown in FIG. 10A, the timing window of the wire 21 is from time t1 to time t3. Meanwhile, as shown in FIG. 10B, the timing window of the wire 22 is from time t2 to time t4. Therefore, the timing window of the wire 21 and the wire 22 overlap each other in the range from time t2 to time t3. In addition, as shown in FIG. 10C, the timing window of the wire 23 is from time t5 to time t8. Meanwhile, as shown in FIG. 10D, the timing window of the wire 24 is from time t6 to time t7. Therefore, the timing window of the wire 23 and the wire 24 overlap each other in the range from the time t6 to the time t7.

Figure 8:
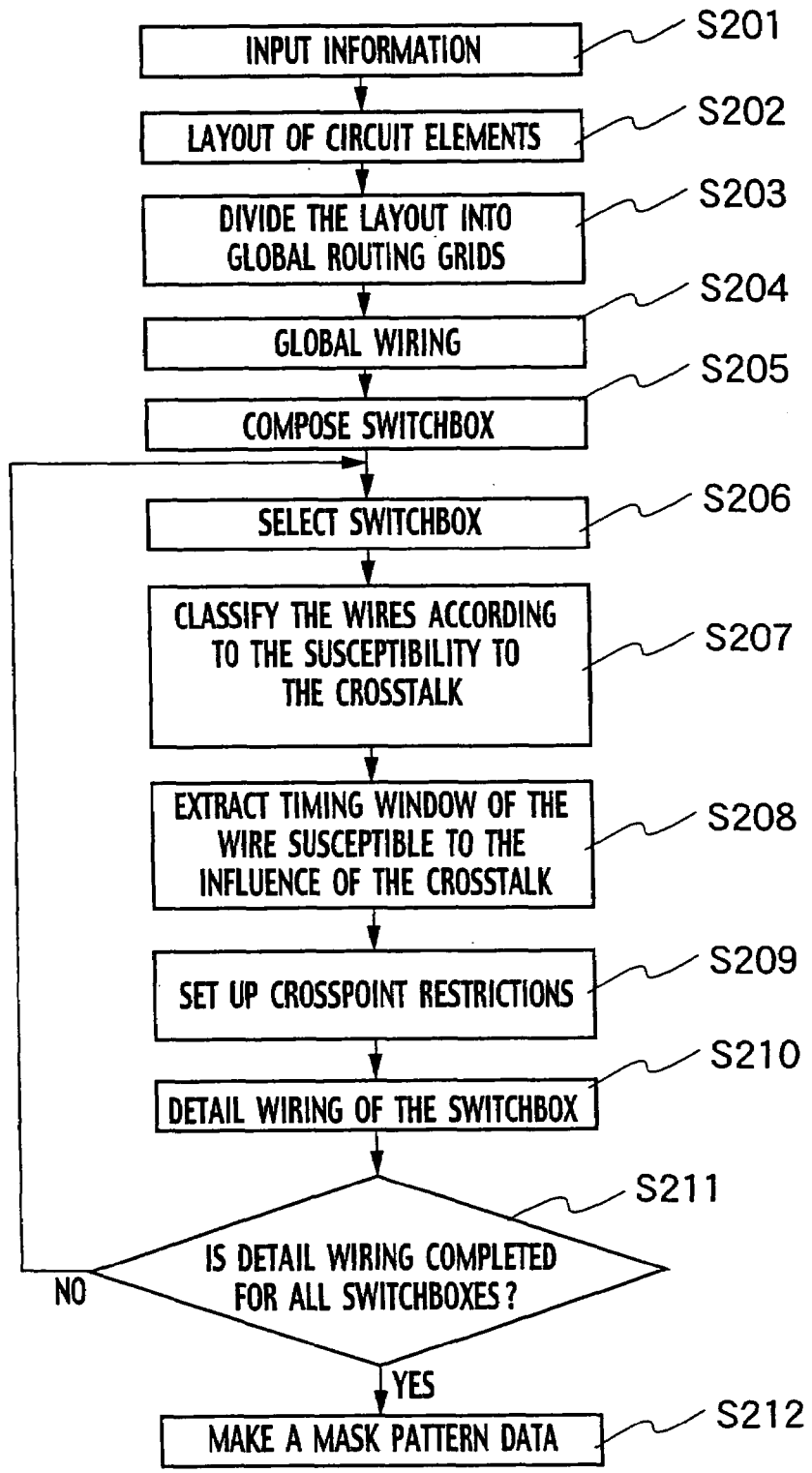
FIG. 8 is a flowchart explaining an automatic design method of the semiconductor integrated circuit according to a first modified example of the first embodiment of the present invention.
Figure 9:
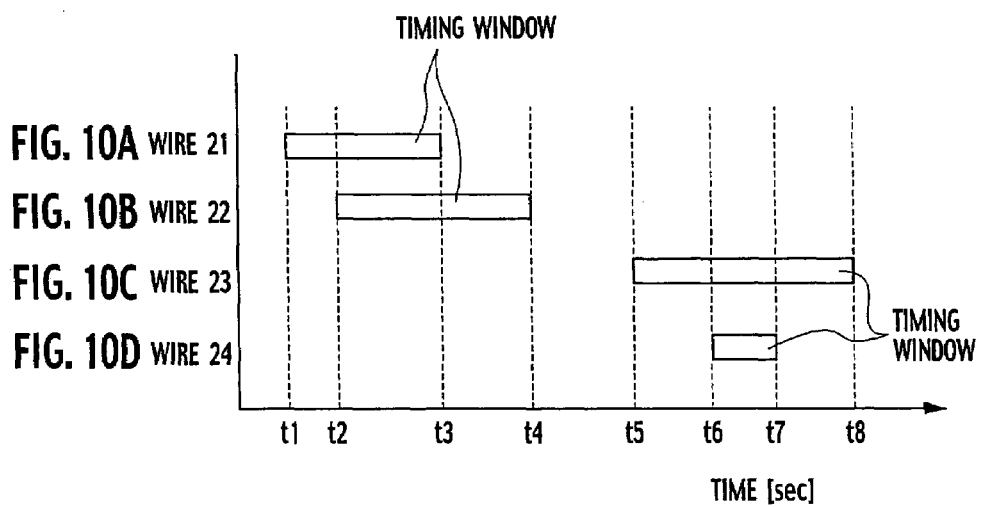
FIG. 9 is a table showing an example of susceptibility to the influence of crosstalk of wires passing through the switchbox.

(a) In Step S201 of FIG. 8, the wiring restriction data that a couple of the global wires being susceptible to the influence of crosstalk and having the overlapping timing window fail to pass through adjacent points of the boundary of the switchbox, are stored in the wiring restriction data area 303 shown in FIG. 2. The adjacent points are defined by the global routing grids.

(b) In Step S208 of FIG. 8, the timing window of the wires 21 to 24 susceptible to the influence of crosstalk are extracted from the circuit information stored in the circuit information area 301. The extracted timing windows are stored in the global wiring data area 313.

Figures 11, 12:
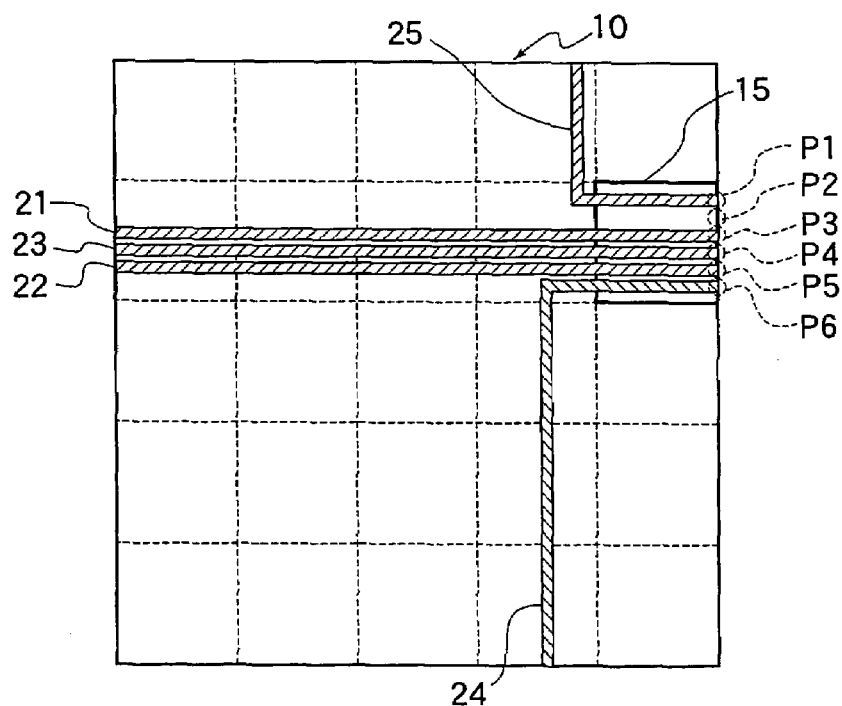
FIG. 11 is a table showing an example of a crosspoint restriction set up by the automatic design method of the semiconductor integrated circuit according to the first modified example of the first embodiment of the present invention.
FIG. 12 is a schematic view showing an example of the switchbox to explain detail wiring by the automatic design method of the semiconductor integrated circuit according to the first modified example of the first embodiment of the present invention.

(c) Next, in Step S209, the crosspoint restriction setting module 405 reads the timing windows stored in the global wiring data area 313 and the wiring restriction data stored in the wiring restriction data area 303, and sets up the crosspoint restrictions based on the wiring restriction data. Concretely, the crosspoint restrictions including the restrictions that "the wire 21 and the wire 22 fail to pass through the mutually adjacent crosspoints" and that "the wire 23 and the wire 24 fail to pass through the mutually adjacent crosspoints" are set up. As a result, the crosspoint restrictions as shown in FIG. 11, for example, are set up and are stored in the crosspoint setting data area 315.

(d) In Step S210, the detail wiring module 406 reads the crosspoint restrictions stored in the crosspoint setting data area 315, and carries out the detail wiring of the switchbox 10. FIG. 12 shows the example of the detail wiring of the switchbox 10 carried out based on the crosspoint restrictions of FIG. 11. The wire 21 passes through the crosspoint P3, the wire 22 passes through the crosspoint P5, the wire 23 passes through the crosspoint P4, the wire 24 passes through the crosspoint P6, and the wire 25 passes through the crosspoint P1.

According to the wiring restriction data that the wires susceptible to the influence of crosstalk and having overlapping timing window that fail to pass through mutually adjacent crosspoints, it is possible to reduce the influence of crosstalk in the semiconductor integrated circuit. The rest of the operations are basically similar to the automatic designing method for a semiconductor integrated circuit according to the first embodiment of the present invention. A duplicate description will therefore be omitted herein.

(Second Modified Example)

Another example of the detail wiring considering the timing window of the wires, uses as setting of the crosspoint restrictions and the detail wiring as an example and will be described, in accordance with a method of classifying the wires, with overlapping timing window, into wire groups, by using the designing system of FIG. 2 and a flowchart of FIG. 13. This example is different from the automatic designing method shown in FIG. 1 in that the crosspoint restrictions are set up while setting up the wiring groups depending on the timing window of the wires. The example will be described below in the case where the wires 21 to 25, having susceptibility to the influence of crosstalk as shown in FIG. 9, pass through the global routing grid 15 of the switchbox 10 subject to the detail wiring. The timing windows of the wires 21 to 24 are as shown in FIGS. 10A to 10D.

Figure 13:
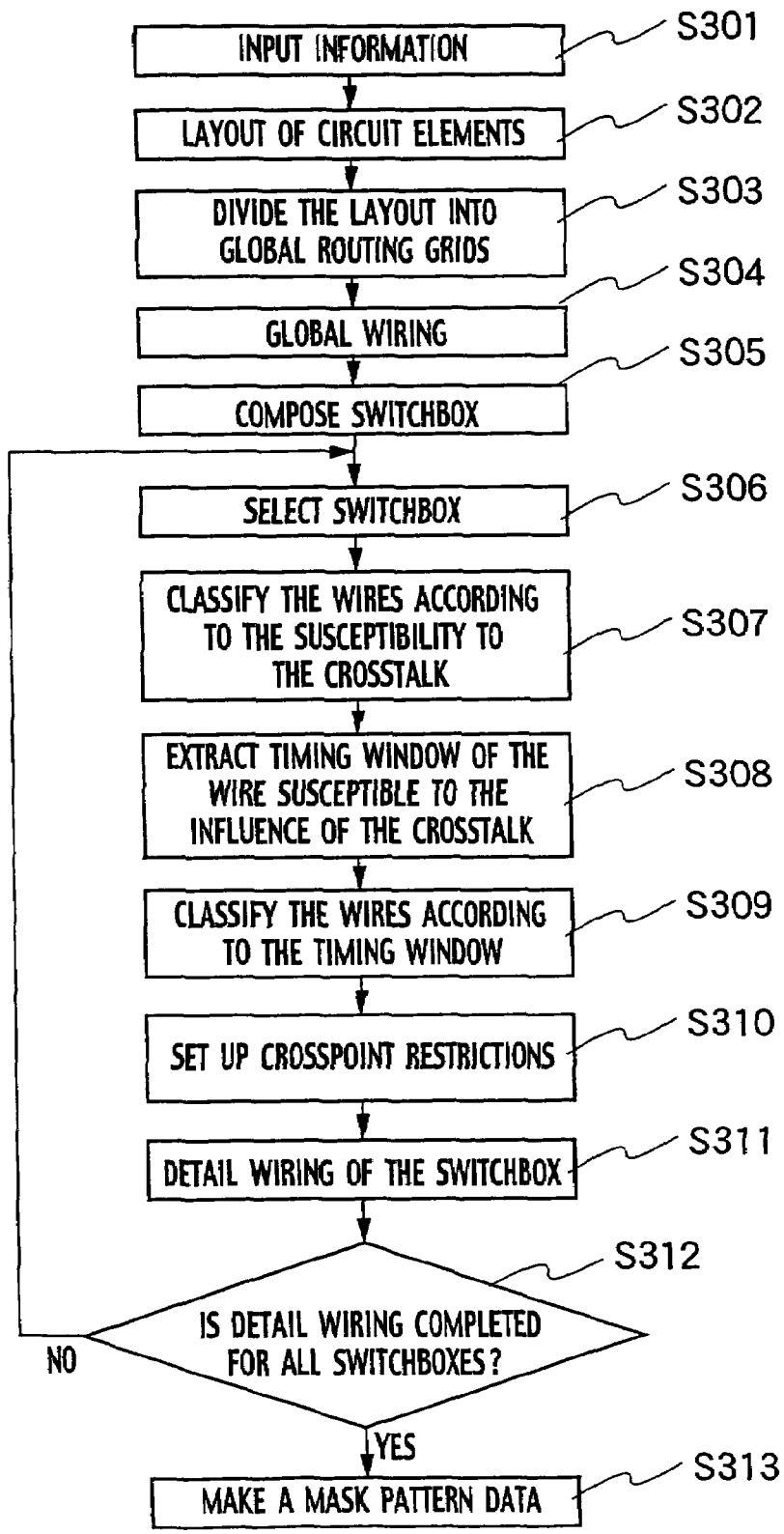
FIG. 13 is a flowchart explaining an automatic design method of the semiconductor integrated circuit according to a second modified example of the first embodiment of the present invention.

(a) In Step S301 of FIG. 13, the wiring restriction data that different wire groups pass through the mutually adjacent crosspoints is stored in the wiring restriction data area 303 shown in FIG. 2.

(b) In Step S308, the timing windows of the global wires passing through the global routing grid 15 of the switchbox 10 and being susceptible to the influence of crosstalk are extracted from the circuit information stored in the circuit information area 301. The extracted timing windows are stored in the global wiring data area 313.

(c) Next, in Step S309, the global wiring module 402 reads the timing windows stored in the global wiring data area 313, and classifies the wires into wire groups depending on the wires having overlapping timing windows. Concretely, the wire 21 and the wire 22 are classified into the same wire group, and the wire 23 and the wire 24 are classified into the same wire group. The information on the classification is stored in the global wiring data area 313.

(d) In Step S310, the crosspoint restriction setting module 405 reads the classification information of the wire groups stored in the global wiring data area 313 and the wiring restriction data stored in the wiring restriction data area 303, and sets up the crosspoint restrictions based on the wiring restriction data. The crosspoint restrictions thus set up are stored in the crosspoint setting data area 315.

(e) In Step S311, the detail wiring module 406 reads the crosspoint restrictions stored in the crosspoint setting data area 315, and carries out the detail wiring of the switchbox 10.

A result similar to the detail wiring shown in FIG. 12, for example, is also obtained by the above-described method. Specifically, when the detail wiring is carried out on the wiring restriction data and different wiring groups pass through mutually adjacent crosspoints, the wires susceptible to the influence of crosstalk and having overlapping timing window fail to pass through the mutually adjacent crosspoints. Accordingly, it is possible to reduce the influence of crosstalk in the semiconductor integrated circuit. The rest of the operations are basically similar to the automatic designing method for a semiconductor integrated circuit according to the first embodiment of the present invention. A duplicate description will therefore be omitted herein.

(Third Modified Example)

When the semiconductor integrated circuit has a plurality of clock signal systems, it is uncertain as to whether the timing window overlap each other between wires that belong to different clock signal systems. Therefore, it is necessary to consider that the timing windows always overlap each other between the wires that belong to different clock signal systems. An example of the setting of the crosspoint restrictions and the detail wiring in the automatic designing method for a semiconductor integrated circuit will be described, according to the first embodiment of the present invention, when there are a plurality of clock signal systems in the semiconductor integrated circuit by use of the designing system of FIG. 2 and a flowchart of FIG. 14. This example is different from the automatic designing method shown in FIG. 1 in that the crosspoint restrictions are set up while considering the plurality of clock signal systems of the wires. In the following, the example will be described in the case where wires 31 to 34 belonging to signal systems as shown in FIG. 15 pass through the global routing grid 15 of the switchbox 10 subject to the detail wiring. Here, the wires 31 to 34 are wires susceptible to the influence of crosstalk.

Figure 14:
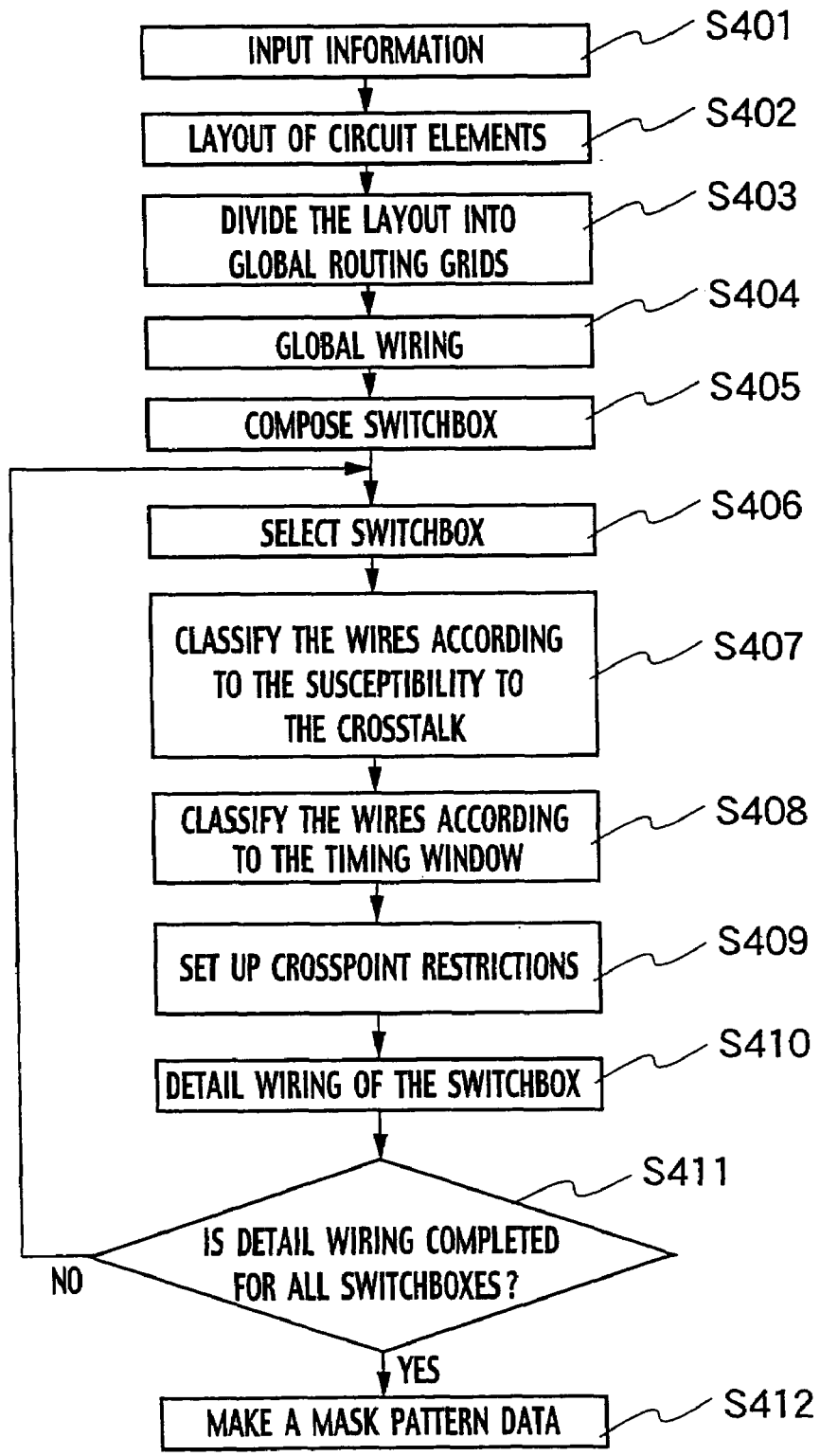
FIG. 14 is a flowchart explaining an automatic design method of the semiconductor integrated circuit according to a third modified example of the first embodiment of the present invention.

(a) In Step S401 of FIG. 14, the wiring restriction data that a couple of the global wires being susceptible to the influence of crosstalk and belonging to different clock signal systems fail to pass through adjacent points of the boundary of the switchbox, are stored in the wiring restriction data area 303 shown in FIG. 2.

(b) In Step S408, the crock signal systems to which the wires 31 to 34 belong to are extracted from the circuit information stored in the circuit information area 301, and the wires belonging to the same clock signal system are classified into the same wire group. Concretely, the wire 31 and the wire 32 which belong to the first clock signal system are classified into a first wire group, for example. Meanwhile, the wire 33 and the wire 34 which belong to the second clock signal system are classified into a second wire group, for example. The information on the wire groups is stored in the global wiring data area 313.

(c) Next, in Step S409, the crosspoint restriction setting module 405 reads the information on the wire groups stored in the global wiring data area 313 and the wiring restriction data stored in the wiring restriction data area 303, and sets up the crosspoint restrictions based on the wiring restriction data. Concretely, the crosspoint restrictions including the restriction that "the wire 31 and the wire 32 fail to pass through the crosspoints which are adjacent to either the wire 33 or the wire 34" are set up, for example. As a result, the crosspoint restrictions are set up as shown in FIG. 16, for example. The crosspoint restrictions thus set up are stored in the crosspoint setting data area 315.

Figure 17:
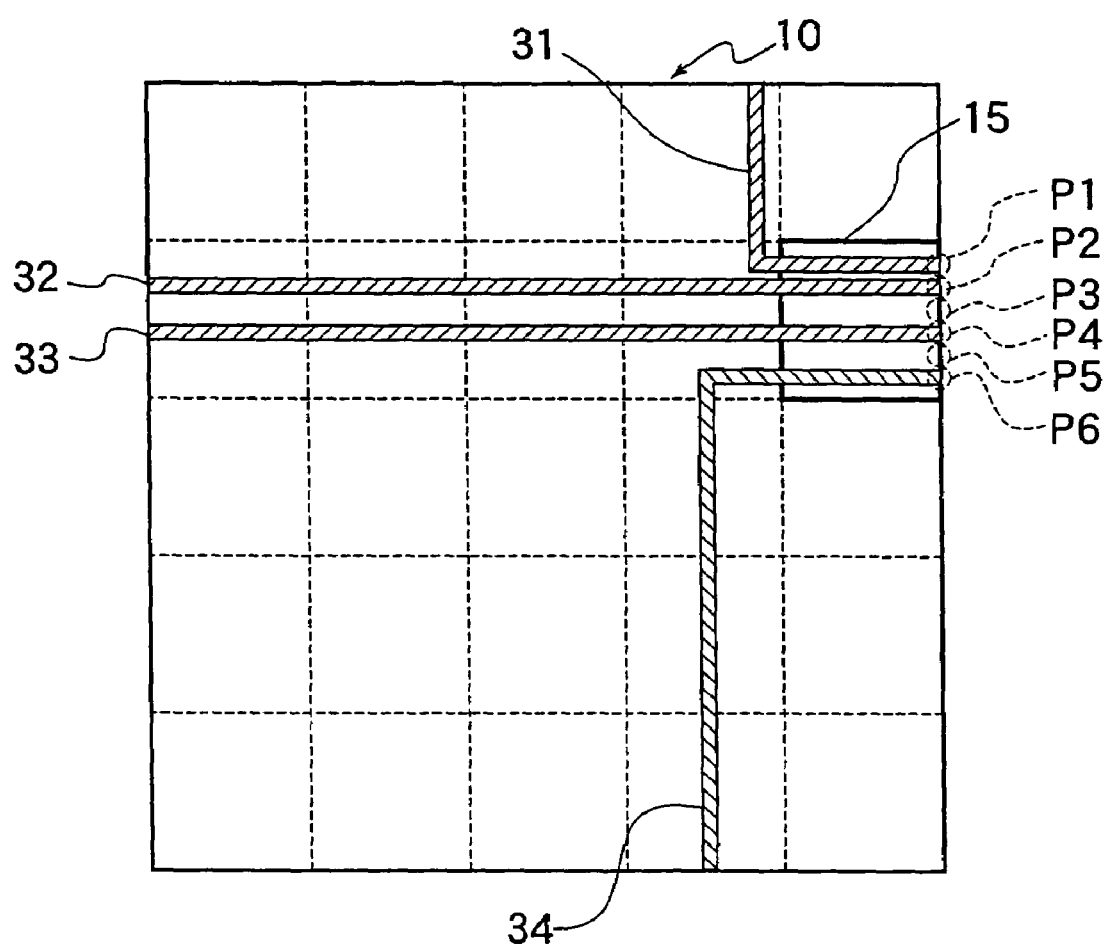
FIG. 17 is a schematic view showing an example of the switchbox to explain detail wiring by the automatic design method of the semiconductor integrated circuit according to the third modified example of the first embodiment of the present invention.

(d) In Step S410, the detail wiring module 406 reads the crosspoint restrictions stored in the crosspoint setting data area 315, and carries out the detail wiring of the switchbox 10. FIG. 17 is an example of carrying out the detail wiring of the switchbox 10 based on the crosspoint restrictions of FIG. 16. The wire 31 passes through the crosspoint P1, the wire 32 passes through the crosspoint P2, the wire 33 passes through the crosspoint P4, and the wire 34 passes through the wiring point P6.

By setting up the crosspoint restriction so that the wires belonging to different clock signal systems and having a susceptibility to the influence of crosstalk and fail to pass through mutually adjacent crosspoints, it is possible to reduce the influence of crosstalk between the wires, which belong to different clock signal systems and are uncertain as to whether the timing windows thereof overlap each other. The rest of the operations are basically similar to the automatic designing method for a semiconductor integrated circuit according to the first embodiment of the present invention. A duplicate description will therefore be omitted herein.

(Fourth Modified Example)

If a signal having shorter transition time changes while a signal having longer transition time is changing, there is a risk of causing a crosstalk noise or a crosstalk delay on the wire that has the longer signal transition time. Therefore, it is necessary to avoid the wires having a large difference in signal transition time from being adjacent to each other. An example of the setting of the crosspoint restrictions and the detail wiring in the automatic designing method for a semiconductor integrated circuit will be described, according to the first embodiment of the present invention, when the transition time of the signals transmitted on the wires is different by use of the designing system of FIG. 2 and a flowchart of FIG. 18. This example is different from the automatic designing method shown in FIG. 1 in that the crosspoint restrictions are set up while considering the transition time of the signals transmitted on the wires. In the following, the example will be described in the case where wires 41 to 45 being susceptible to the influence of crosstalk and have the signal transition time as shown in FIG. 19 pass through the global routing grid 15 of the switchbox 10 subject to the detail wiring. A difference in signal transition time which causes a crosstalk delay depends on the design rule such as the wire width or the space between wires, on the voltage values of the signals transmitted on the wires, and the like. Here, the example will be described below on the assumption that it is highly likely to cause a crosstalk delay when there is a difference equal to or greater than 1 ns.

Figure 18:
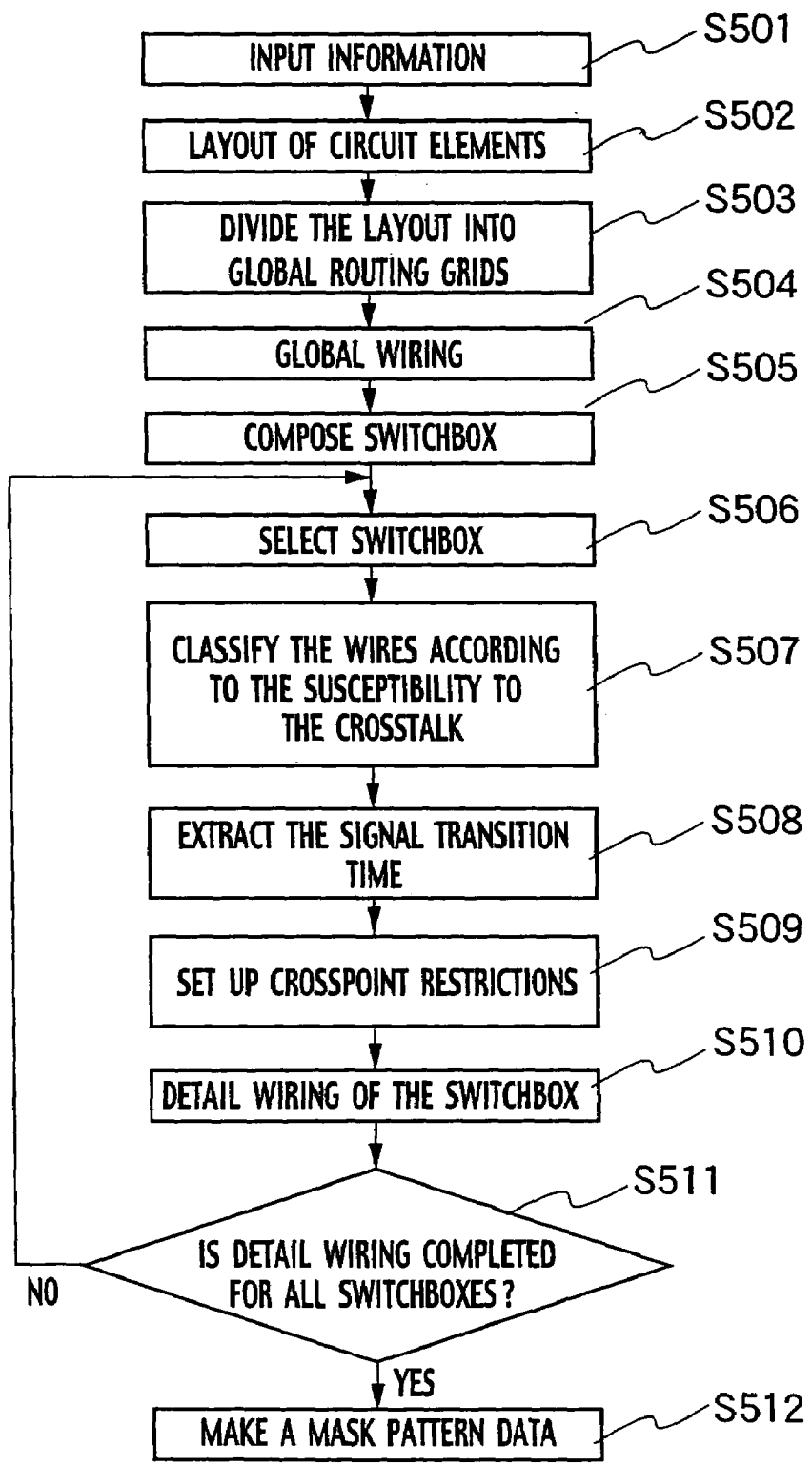
FIG. 18 is a flowchart explaining an automatic design method of the semiconductor integrated circuit according to a fourth modified example of the first embodiment of the present invention.

(a) In Step S501 of FIG. 18, the wiring restriction data that a couple of the global wires having the difference in signal transition time equal to or greater than 1 ns fail to pass through adjacent points of the boundary of the switchbox, are stored in the wiring restriction data area 303 shown in FIG. 2.

(b) Next, in Step S508, the signal transition times for the wires 41 to 45 are extracted from the circuit information stored in the circuit information area 301, and are stored in the global wiring data area 313.

(c) Next, in Step S509, the crosspoint restriction setting module 405 reads the signal transition time of the wires stored in the global wiring data area 313 and the wiring restriction data stored in the wiring restriction data area 303, and sets up the crosspoint restrictions based on the wiring restriction data. Concretely, the crosspoint restrictions including the restriction that "the wire 41 and the wire 42 fail to pass through the crosspoints which are adjacent to the wire 45" are set up. As a result, the crosspoint restrictions as shown in FIG. 20, for example, are stored in the crosspoint setting data area 315.

Figure 21:
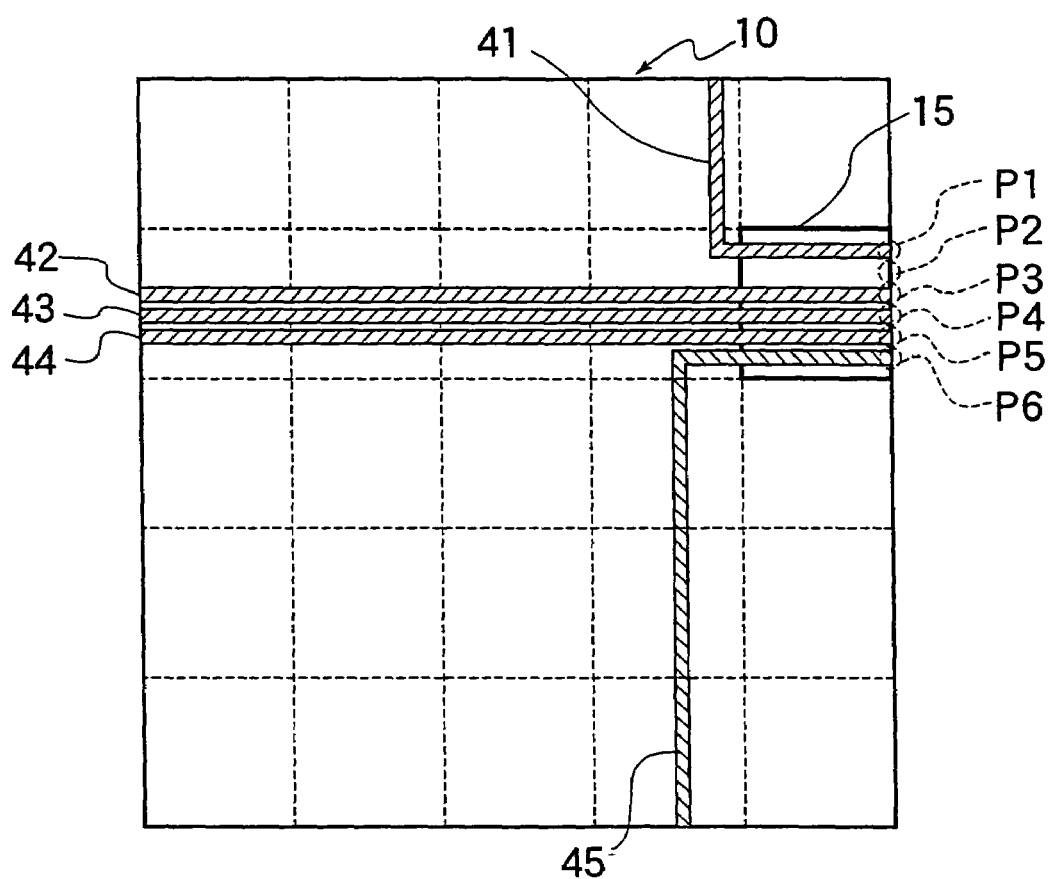
FIG. 21 is a schematic view showing an example of the switchbox to explain detail wiring by the automatic design method of the semiconductor integrated circuit according to the fourth modified example of the first embodiment of the present invention.

(d) Next, In Step S510, the detail wiring module 406 reads the crosspoint restrictions stored in the crosspoint setting data area 315, and carries out the detail wiring of the switchbox 10 based on the crosspoint restrictions. FIG. 21 is an example of carrying out the detail wiring of the switchbox 10 based on the crosspoint restrictions of FIG. 20. The wire 41 passes through the crosspoint P1, the wire 42 passes through the crosspoint P3, the wire 43 passes through the crosspoint P4, the wire 44 passes through the wiring point P5, and the wire 45 passes through the crosspoint P6.

A method of setting the crosspoint restriction that the wires having a large difference in signal transition time fail to pass through the mutually adjacent crosspoints includes a method of allowing the wires to pass through the crosspoints while sorting the wires in the order of the transition time thereof, for example.

By avoiding the wires having a large difference in signal transition time from being adjacent to each other, it is possible to reduce the risk of causing crosstalk noise or crosstalk delay in the semiconductor integrated circuit. The rest of the operations are basically similar to the automatic designing method for a semiconductor integrated circuit according to the first embodiment of the present invention. A duplicate description will therefore be omitted herein.

Second Embodiment

Figures 24, 25:
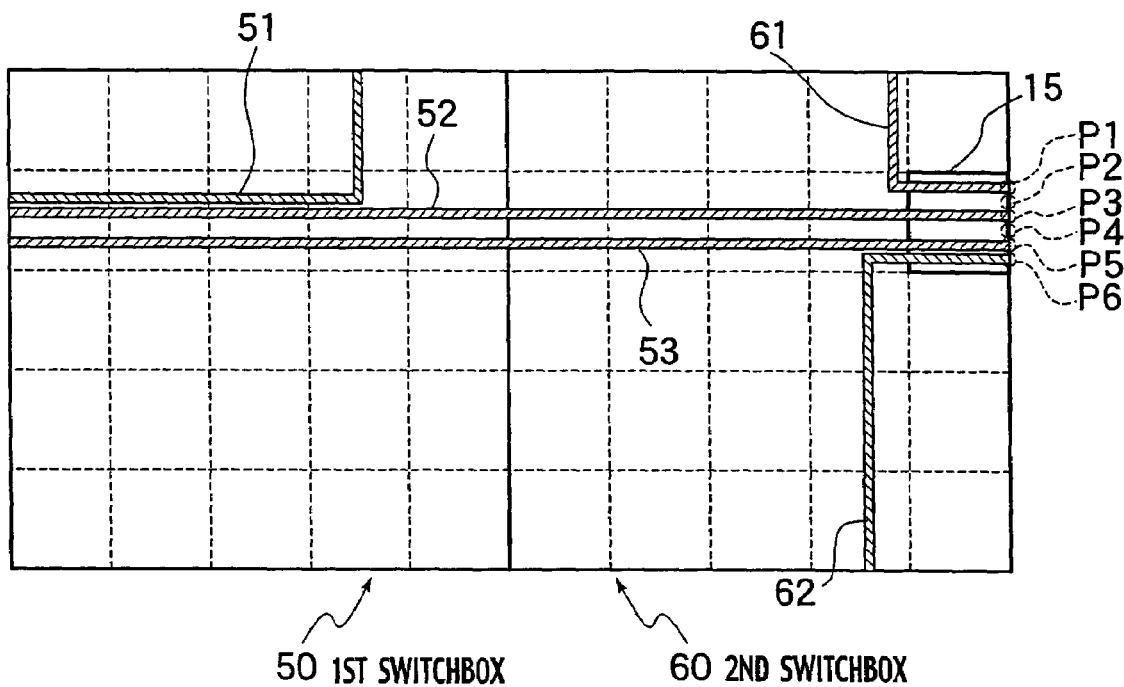
FIG. 24 is a schematic view showing an example of the switchbox to explain detail wiring by the automatic design method of the semiconductor integrated circuit according to the second embodiment of the present invention.
FIG. 25 is a table showing an example of wires passing through a first switchbox or a second switchbox.

As it has been described already in the first embodiment, the designing of the detail wiring of the semiconductor integrated circuit, which is composed of a continuous arrangement of a plurality of switchboxes each including a plurality of global routing grids, is carried out by subjecting the switchboxes sequentially to the detail wiring in accordance with certain priorities. In this case, when a wire 52 is a victim wire and a wire 51 is an aggressor wire in a first switchbox 50, shown in FIG. 24, which has been subjected to the detail wiring earlier, then it is necessary to set up the crosspoint restrictions for a second switchbox 60 to avoid a wire which has a timing window that overlaps a timing window of the wire 51 from being adjacent to the wire 52. This is because when the timing windows of a plurality of mutually adjacent aggressor wires overlap each other, the crosstalk noise caused in the victim wire will be enormous, and a risk of malfunction of the semiconductor integrated circuit is thereby increased. FIG. 24 shows an example of carrying out the detail wiring of the second switchbox 60 while considering the victim wire of the first switchbox 50, which has been subjected to the detailed wiring earlier. A wire 51, a wire 52, and a wire 53 pass through the first switchbox 50, and the wire 52 is the victim wire that receives the influence of the crosstalk from the wire 51. The wire 52, the wire 53, a wire 61, and a wire 62 shown in FIG. 25 pass through the global routing grid 55 of the second switchbox 60. As shown in FIG. 26A, the timing window of the wire 53 passing through the second switchbox 60 and being susceptible to the influence of the crosstalk is from time t2 to time t4. Meanwhile, as shown in FIG. 26B, the timing window of the wire 61 is from time t5 to time t8. In addition, as shown in FIG. 26C, the timing window of the wire 51 constituting the aggressor wire for the wire 52 in the first switchbox 50 is from time t1 to time t3. That is, the timing windows of the wire 53 and the wire 51 overlap each other in the range from the time t2 to the time t3. The crosspoint restriction is therefore set such that the wire 52 and the wire 53 fail to pass through the mutually adjacent crosspoints of the global routing grid 55 of the second switchbox 60, and the detail wiring is carried out accordingly.

Figure 22:
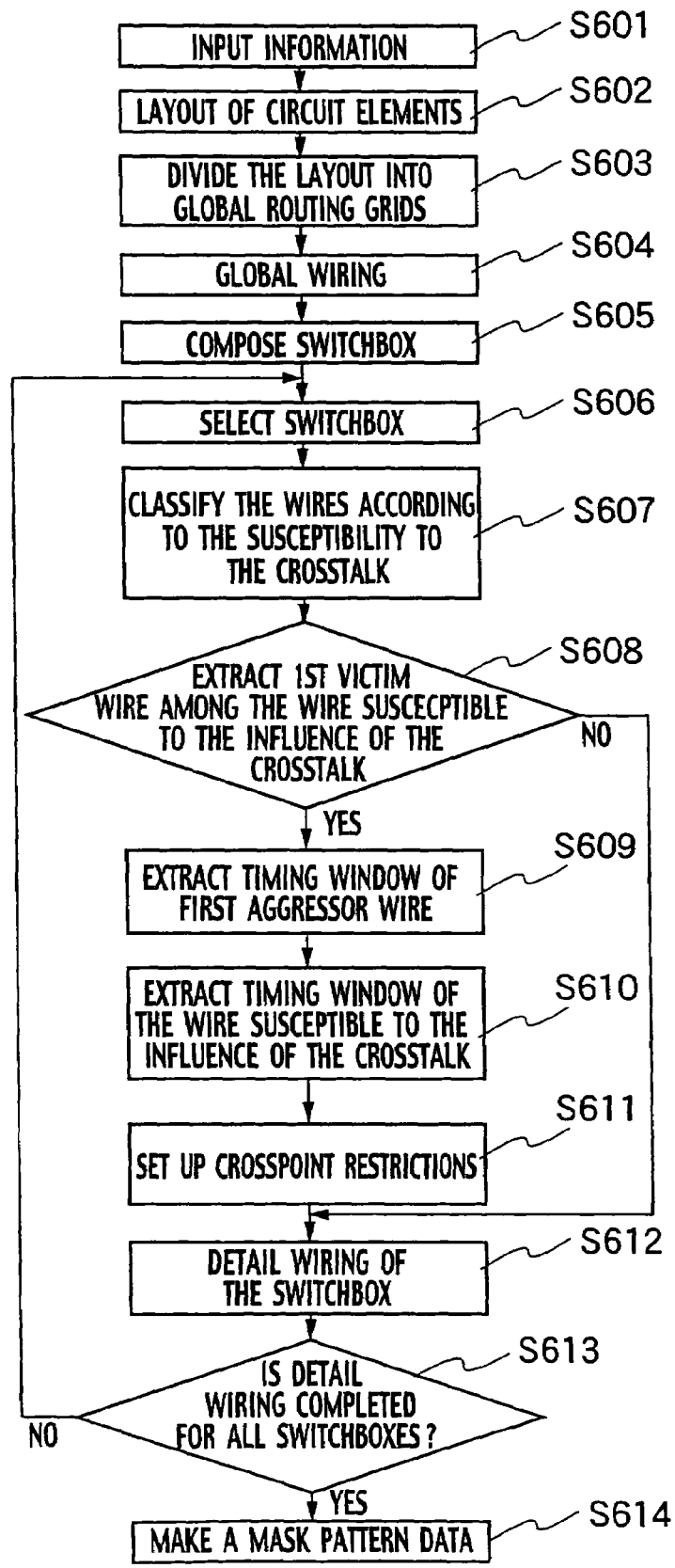
FIG. 22 is a flowchart explaining an automatic design method of a semiconductor integrated circuit according to a second embodiment of the present invention.

To achieve the above-described automatic wiring, as shown in FIG. 22, an automatic designing method for a semiconductor integrated circuit according to a second embodiment of the present invention is different from the automatic designing method for a semiconductor integrated circuit according to the first embodiment in that the automatic designing method of the second embodiment includes the step for setting the crosspoint restriction while considering the victim wire in the switchbox which has been subjected to the detail wiring earlier.

Figure 23:
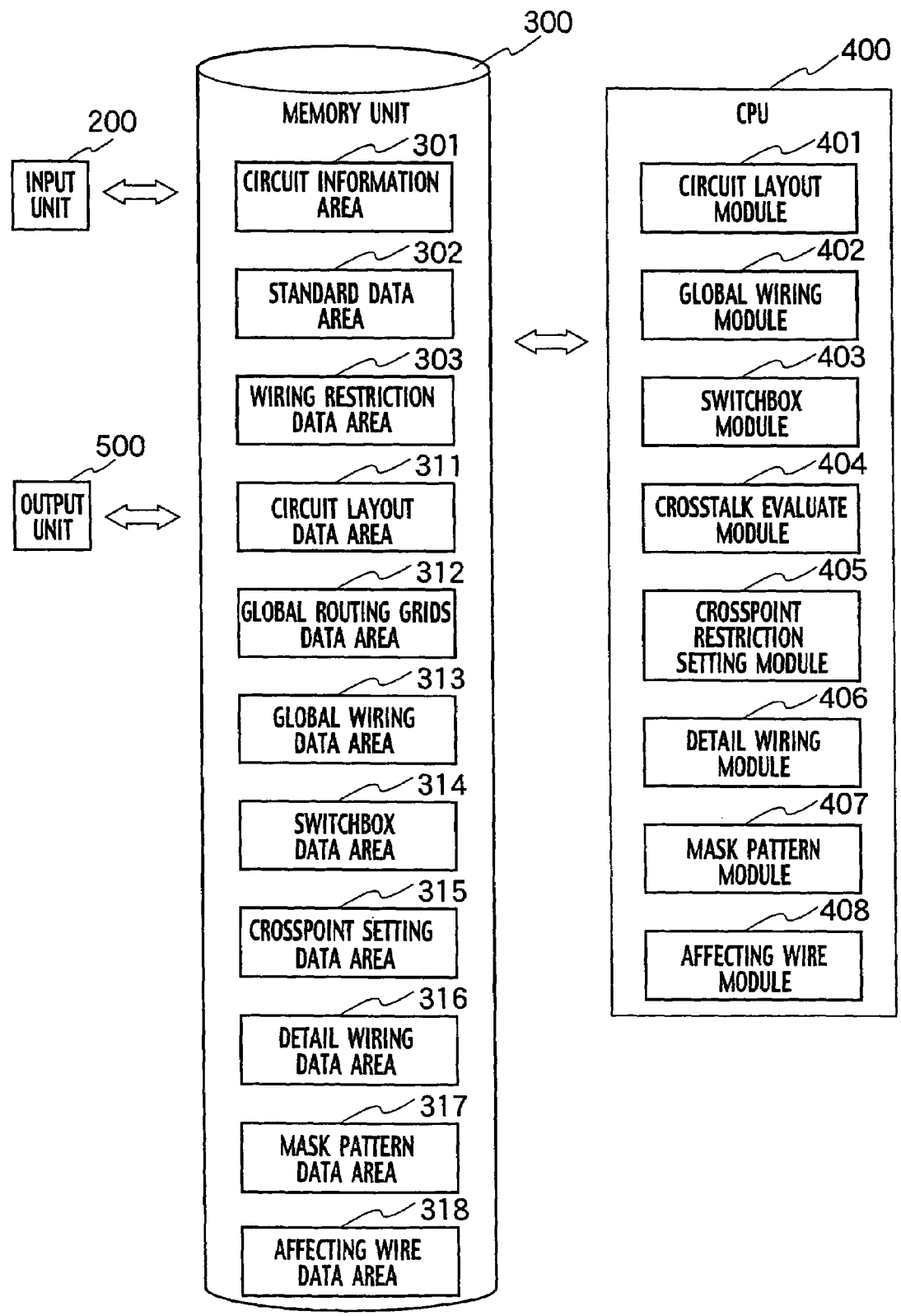
FIG. 23 is a view showing a schematic circuit configuration of the designing system carrying out the automatic design method of the semiconductor integrated circuit according to the second embodiment of the present invention.

The automatic designing method for a semiconductor integrated circuit shown in FIG. 22 can be executed by a designing system shown in FIG. 23, for example. The designing system shown in FIG. 23 includes an input unit 200, a memory unit 300, a CPU 400, and an output unit 500. The memory unit 300 includes a circuit information area 301, a standard data area 302, a wiring restriction data area 303, a circuit layout data area 311, a global routing grid data area 312, a global wiring data area 313, a switchbox data area 314, a crosspoint setting data area 315, a detail wiring data area 316, a mask pattern data area 317, and an affecting wire area 318.

Meanwhile, the CPU 400 includes a circuit layout module 401, a global wiring module 402, a switchbox module 403, a crosstalk evaluate module 404, a crosspoint restriction setting module 405, a detail wiring module 406, a mask pattern module 407, and an affecting wire module 408.

The designing system of this embodiment is different from the designing system shown in FIG. 2 in that the memory unit 300 includes the affecting wire area 318 and that the CPU 400 includes the affecting wire module 408. The affecting wire module 408 judges as to whether there is a wire from among a plurality of the global wires passing through the switchbox currently subjected to the detail wiring, which constitutes the victim wire in the switchbox that has been subjected to the detail wiring earlier (such a victim wire will be hereinafter referred to as a "first victim wire"). When there is the first victim wire, the affecting wire module 408 extracts information on the first victim wire and a timing window of an aggressor wire corresponding to the victim wire (such an aggressor wire will be hereinafter referred to as a "first aggressor wire"). The extracted timing window of the first aggressor wire is stored in the affecting wire area 318.

To judge as to whether there is the first victim wire in the switchbox currently subjected to the detail wiring, when there is the wire deemed as the victim wire in the switchbox which has been subjected to the detail wiring earlier, the information that the wire constitutes the first victim wire is stored in the detail wiring data area 316 shown in FIG. 23 in Step S612 of FIG. 22. In this way, it is possible to judge whether the wire constitutes the first victim wire in the detail wiring of the switchbox thereafter. Moreover, storing the information such as the timing window of the first aggressor wire in the detail wiring data area 316, makes it possible to use the information for extracting the timing window of the aggressor wire.

An example will be described below of the setting of the crosspoint restrictions and the detail wiring when there is the victim wire of the switchbox that has been subjected to the detail wiring, by use of the flowchart of FIG. 22 and the designing system of FIG. 23. In the following, the example will be described in the case where the detail wiring of the second switchbox 60 is carried out after the detail wiring of the first switchbox 50 shown in FIG. 24.

(a) In Step S608 of FIG. 22, the affecting wire module 408 reads the information on the detail wiring stored in the detail wiring data area 316 and the information on the global wires stored in the global wiring data area 313. Then, the affecting wire module 408 judges as to whether there is the first victim wire from among a plurality of the global wires passing through the selected switchbox by means of making reference to the information on the detail wiring and the information on the global wires. When there is not the first victim wire, the process moves to Step S612. When there is the first victim wire, the timing window of the first aggressor wire is extracted from the detail wiring data area 316 and is stored in the affecting wire area 318.

(b) In Step S610, the timing windows of the wire 53 and the wire 61 susceptible to the influence of crosstalk are extracted from the circuit information stored in the circuit information area 301. The extracted timing windows are stored in the global wiring data area 313.

Figure 27:
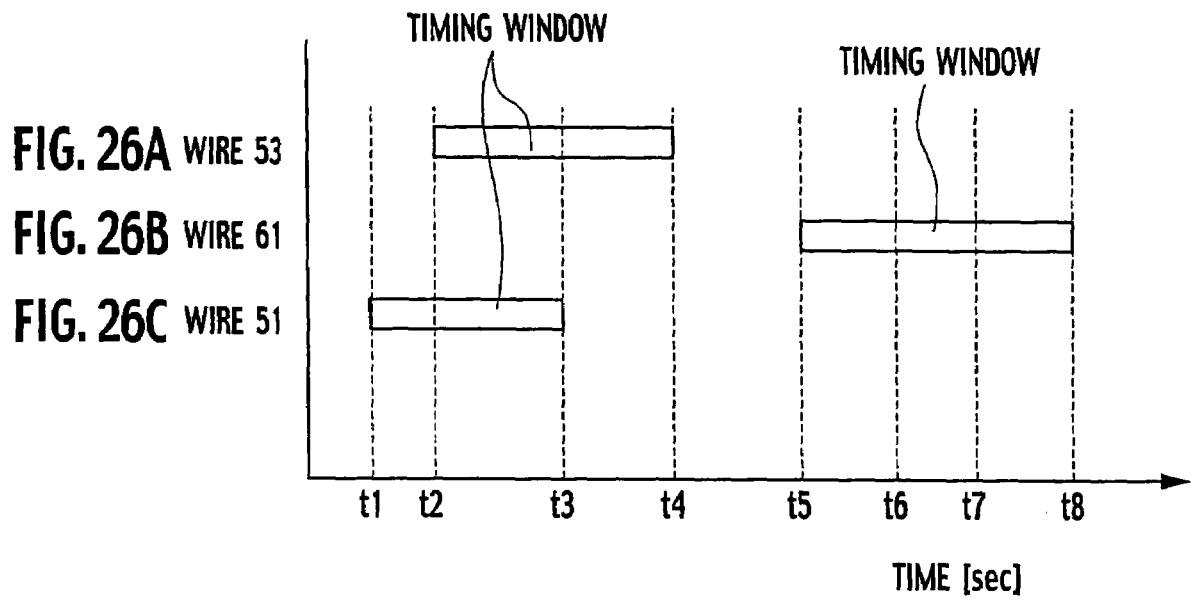
FIG. 27 is a table showing an example of a crosspoint restriction set up by the automatic design method of the semiconductor integrated circuit according to the second embodiment of the present invention.

(c) In Step S611, the crosspoint restriction setting module 405 reads the timing window of the first aggressor wire stored in the affecting wire area 318, the timing windows of the global wires stored in the global wiring data area 313, and the wiring restriction data stored in the wiring restriction data area 303. Then, the crosspoint restriction setting module 405 sets up crosspoint restrictions based on the wiring restriction data. Concretely, the crosspoint restrictions including the restriction that "the wire 52 and the wire 53 fail to pass through the mutually adjacent crosspoints" are set up. As a result, the crosspoint restrictions as shown in FIG. 27, for example, are set up and are stored in the crosspoint setting data area 315.

(d) In Step S612, the detail wiring module 406 reads the crosspoint restrictions stored in the crosspoint setting data area 315, and carries out the detail wiring of the second switchbox 60 based on the crosspoint restrictions. FIG. 24 is an example of carrying out the detail wiring of the second switchbox 60 based on the crosspoint restrictions of FIG. 27. The wire 52 passes through the crosspoint P3, the wire 53 passes through the crosspoint P5, the wire 61 passes through the crosspoint P1, and the wire 62 passes through the crosspoint P6. If the victim wire occurs in the detail wiring, the information on the victim wire and the timing window of the corresponding aggressor wire are stored in the detail wiring data area 316.

As described above, by avoiding a plurality of aggressor wires and the victim wire, which have overlapping timing windows, from being adjacent to one another while considering the victim wire of the switchbox which has been subjected to the detail wiring earlier, it is possible to reduce the possibility of malfunction of the semiconductor integrated circuit due to crosstalk noise. The rest of the operations are substantially the same as the first embodiment. A duplicate description will therefore be omitted herein.

OTHER EMBODIMENTS

The first and second embodiments have been described in the example in which there was one wiring restriction data in the detail wiring. However, it is also possible to set up a plurality of wiring restriction data and to carry out the detail wiring. In this way, it is possible to reduce the influence of crosstalk in the semiconductor integrated circuit. Moreover, if all the wiring restriction data are not satisfied due to high wiring density, it is possible to set up priorities from among the wiring restriction data in light of the magnitude of the influence of crosstalk in the semiconductor integrated circuit.

Various modifications will become possible for those skilled in the art after receiving the teachings of the present disclosure without departing from the scope thereof.

What is claimed is:

1. A computer implemented method for designing a semiconductor integrated circuit comprising:
    extracting a global wire susceptible to an influence of crosstalk from among a plurality of global wires passing through a switchbox including a plurality of global routing grids based on a crosstalk standard;
    setting up a crosspoint restriction to restrict a plurality of crosspoints of the global wire susceptible to the influence of the crosstalk intersects with a boundary of the switchbox, based on a wiring restriction data, the crosspoint restriction providing a restricted set of crosspoints on the boundary that are determined as allowable crossing points for the global wire in a subsequent wiring process; and
    carrying out detail wiring of the switchbox including selecting a crosspoint based on crosspoint restriction information so that the global wire passes through the crosspoint selected.

2. The method of claim 1, wherein the crosstalk standard is set up based on a wire width and a space between wires.

3. The method of claim 1, wherein the crosstalk standard relates to a wire length.

4. The method of claim 1, wherein the crosspoint restriction is so prescribed that a crosspoint where one of the global wires susceptible to the influence of crosstalk passing through a boundary of the switchbox fails to neighbor another crosspoint where another one of the global wires susceptible to the influence of crosstalk passing through the boundary.

5. The method of claim 1, wherein the wiring restriction data includes a restriction on global wires having an overlapping timing window.

6. The method of claim 5, wherein the restriction is so prescribed that a couple of the global wires having the overlapping timing window MI to pass through adjacent crosspoints of the boundary of the switchbox, the adjacent crosspoints are defined by the global routing grids.

7. The method of claim 1, further comprising:
    classifying the global wires having an overlapping timing window into wire groups; and
    setting up the crosspoint restriction based on information of the groups.

8. The method of claim 1, wherein the wiring restriction data includes a restriction on global wires belonging to different clock signal systems.

9. The method of claim 8, wherein the restriction is so prescribed that a couple of the global wires belonging to different clock signal systems fail to pass through adjacent crosspoints of the boundary of the switchbox, the adjacent crosspoints are defined by the global routing grids.

10. The method of claim 1, wherein the wiling restriction data includes a restriction based on a difference in signal transition time of global wires.

11. The method of claim 10, wherein the restriction is so prescribed that a couple of the global wires having the difference in signal transition time greater than a standard value fail to pass through adjacent crosspoints of the boundary of the switchbox, the adjacent crosspoints are defined by the global routing grids.

12. The method of claim 11, wherein the standard value is set up based on a wire width and a space between wires.

13. The method of claim 1, wherein priorities of the switchboxes for carrying out the detail wiring are determined by density of global wires.

14. The method of claim 1, wherein priorities of the switchboxes for carrying out the detail wiring are determined by density of global wires susceptible to the influence of the crosstalk.

15. A computer implemented method for carrying out detail wiring sequentially of a plurality of switchboxes in a semiconductor circuit including continuous arrangement of a plurality of switchboxes each including a plurality of global routing grids, comprising:
    storing a timing window of an aggressor wire affecting a victim wire of a first switchbox, in an affecting wire data area;
    extracting a global wire susceptible to an influence of crosstalk from among a plurality of global wires passing through a second switchbox and the first switch box based on a crosstalk standard;
    reading a wiring restriction data stored in a wiring restriction data area and the timing window stored in the affecting wire data area, and setting up a crosspoint restriction to restrict a plurality of crosspoints of the global wire susceptible to the influence of the crosstalk intersecting with a boundary of the second switchbox without setting of the crosspoint restriction, based on the wiring restriction data and on the timing window, the crosspoint restriction providing a restricted set of crosspoints on the boundary that are determined as allowable crossing points for the global wire in a subsequent wiring process; and
    carrying out detail wiring of the second switchbox including selecting a crosspoint based on crosspoint restriction information so that the global wire passes through the crosspoint selected.

16. The method of claim 15, wherein the crosstalk standard is set up based on a wire width and a space between wires.

17. The method of claim 15, wherein the crosstalk standard relates to a wire length.

18. The method of claim 15, wherein the crosspoint restriction is so that a crosspoint where the victim wire passing through a boundary of the second switchbox fails to neighbor another crosspoint where a global wire having a timing window overlapping the timing window of the aggressor wire passing through the boundary.

19. A computer program product stored on a computer-readable medium of a computer for designing a semiconductor integrated circuit, the computer program product comprising:
    instructions configured to extract a global wire susceptible to an influence of crosstalk from among a plurality of global wires passing through a switchbox including a plurality of global routing grids based on a crosstalk standard;
    instructions configured to set up a crosspoint restriction to restrict a plurality of crosspoints of the global wire susceptible to the influence of the crosstalk intersects with a boundary of the switchbox, based on a wiring restriction data, the crosspoint restriction providing a restricted set of crosspoints on the boundary that are determined as allowable crossing points for the global wire in a subsequent wiring process; and
    instructions configured to carry out detail wiring of the switchbox including selecting a crosspoint based on crosspoint restriction information so that the global wire passes through the crosspoint selected.

20. A computer program product stored on a computer-readable medium of a computer for carrying out detail wiring sequentially of a plurality of switchboxes in a semiconductor circuit including continuous arrangement of a plurality of switchboxes each including a plurality of global routing grids, the computer program product comprising:

instructions configured to store a timing window of an aggressor wire affecting a victim wire of a first switchbox, in an affecting wire data area;

instructions configured to extract a global wire susceptible to an influence of crosstalk from among a plurality of global wires passing through a second switchbox and the first switch box based on a crosstalk standard;

instructions configured to read a wiring restriction data stored in a wiring restriction data area and the tuning window stored in the affecting wire data area, and to set up a crosspoint restriction to restrict a plurality of crosspoints of the global wire susceptible to the influence of the crosstalk intersecting with a boundary of the second switchbox without setting of the crosspoint restriction, based on the wiring restriction data and on the timing window, the crosspoint restriction providing a restricted set of crosspoints on the boundary that are determined as allowable crossing points for the global wire in a subseguent wiring process; and instructions configured to carry out detail wiling of the second switchbox including selecting a crosspoint based on crosspoint restriction information so that the global wire passes through the crosspoint selected.

* * * * *